United States Patent [19]
Tsukikawa et al.

[11] Patent Number: 6,005,434
[45] Date of Patent: *Dec. 21, 1999

[54] SUBSTRATE POTENTIAL GENERATION CIRCUIT THAT CAN SUPPRESS VARIATION OF OUTPUT VOLTAGE WITH RESPECT TO CHANGE IN EXTERNAL POWER SUPPLY VOLTAGE AND ENVIRONMENT TEMPERATURE

[75] Inventors: Yasuhiko Tsukikawa; Tsukasa Ooishi, both of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/601,659

[22] Filed: Feb. 14, 1996

[30]      Foreign Application Priority Data

Mar. 31, 1995 [JP] Japan ................................. 7-075784

[51] Int. Cl.$^6$ ...................................................... H03K 3/01
[52] U.S. Cl. ............................................ 327/537; 327/534
[58] Field of Search ..................................... 327/534–537

[56]               References Cited

U.S. PATENT DOCUMENTS

| | | | |
|---|---|---|---|
| 4,964,082 | 10/1990 | Sato et al. ................................. | 327/534 |
| 5,227,675 | 7/1993 | Taguchi ..................................... | 327/534 |

FOREIGN PATENT DOCUMENTS

| | | |
|---|---|---|
| 62-38591 | 2/1987 | Japan . |
| 3-11659 | 1/1991 | Japan . |
| 4-6694 | 1/1992 | Japan . |
| 4-753 | 1/1992 | Japan . |
| 4-38791 | 2/1992 | Japan . |
| 84103894 | 4/1995 | Taiwan . |

OTHER PUBLICATIONS

"Analog MOS Integrated Circuits For Signal Processing", Greorgorian, R. et al., Wiley–Interscience Pulication, 1986, pp. 127–127.

*Primary Examiner*—Kenneth B. Wells
*Attorney, Agent, or Firm*—McDermott, Will & Emery

[57]                ABSTRACT

An output current of a constant current source formed of a gate potential control circuit and a p channel MOSFET is determined only by the sub threshold swing value of a p channel MOSFET and a resistance of a resistor. A signal out 1 controlling the operation of a ring oscillator circuit is switched at a predetermined potential corresponding to the sum of the threshold value of n channel MOSFETs through which the output current flows. Since the output current has no power supply voltage dependency and increases in proportion to the temperature, the predetermined potential is independent of the power voltage. The temperature dependency is also small since the temperature dependency of the output current value and the threshold value cancel each other. Therefore, the substrate potential can be controlled at a stable level unsusceptible to variation in the external operating conditions.

27 Claims, 19 Drawing Sheets

FIG. 6

| PHASE 160 | CONNECTED | DIS-CONNECTED | CONNECTED |
|---|---|---|---|
| PHASE 162 | CONNECTED | CONNECTED | DIS-CONNECTED |
| CHANGE OF \|V$_{BB}$\| | 0 | + | − |

SUBSTRATE POTENTIAL GENERATION CIRCUIT THAT CAN SUPPRESS VARIATION OF OUTPUT VOLTAGE WITH RESPECT TO CHANGE IN EXTERNAL POWER SUPPLY VOLTAGE AND ENVIRONMENT TEMPERATURE

BACKGROUND OF THE INVENTION

1. Field of the Invention

The present invention relates to substrate potential generation circuits, and more particularly, to a structure of a circuit for controlling a substrate bias potential within a predetermined voltage range required for an integrated circuit device such as a semiconductor memory.

2. Description of the Background Art

The source and drain regions of an MOSFET forming an integrated circuit such as a semiconductor memory form a pn junction with the substrate to have a junction capacitance that cannot be neglected in the circuit operation. This junction capacitance becomes the cause of degrading the operation rate of circuitry. The pn junction capacitance can be reduced in proportion to an applied bias in a reverse direction.

Furthermore, under shooting of noise and external signals such as under shooting of the potential of an n⁺ drain region of an MOSFET causes a pn junction to be biased in the forward direction, whereby a small amount of carriers are introduced into the substrate. This introduction of carriers induce the possibility of latch up of a COOS circuit and damage of data stored in a memory cell in a DRAM.

An internal circuit that intentionally applies a reverse bias to the substrate is typically incorporated to solve such a problem.

FIG. 18 is a circuit diagram showing a structure of a conventional substrate potential generation circuit. Referring to FIG. 18, the substrate potential generation circuit mainly includes a substrate potential level detection circuit 100, an oscillator circuit 200, and a charge pump circuit 300.

In substrate potential level detection circuit 100, a p channel MOSFET 102 operating as a current source is connected to a substrate via diode-connected n channel MOSFETs 106 and 108 connected in series to each other, and an n channel MOSFET 104 connected in series to MOSFETs 106 and 108 and having its gate grounded.

When the threshold voltage of n channel MOSFETs 104, 106 and 108 is $V_{thn}$, the potential difference across the gate and source of n channel MOSFET 104 is:

$$|V_o|=|V_{BB}+2V_{thn}| \quad (1)$$

where $V_{BB}$ is a negative value. When substrate potential $V_{BB}$ is sufficiently low and $|V_o|$ is greater than the threshold voltage of n channel MOSFET 104, n channel MOSFET 104 attains an ON state, and the potential of a node n1 attains an L (Logical Low) level.

Conversely, when substrate bias potential $V_{BB}$ is high and potential difference $|V_o|$ is smaller than threshold voltage $V_{thn}$ of n channel MOSFET 104, n channel MOSFET 104 is cut off. In this case, the potential of node n1 is pulled up to an H (Logical High) level by the potential supplied from p channel MOSFET 102 which is ON.

More specifically, substrate potential level detection circuit 100 provides a signal of an L level and an H level to node n1 when the level of substrate bias potential $V_{BB}$ is lower and higher, respectively, than a predetermined potential level (in this case, $-3 \times V_{thn}$).

The potential of node n1 is applied to one input terminal of an NAND circuit 202 in oscillator circuit 200. The output of NAND circuit 202 is applied to the other input terminal of NAND circuit 202 via a series of an even number of stages of inverters 204, 206, . . . , 208.

Therefore, when the potential of node n1 attains an L level, the potential of a node n2 which is the output of NAND circuit 202 is fixed to an H level, so that oscillation does not occur. That is to say, the substrate potential generation circuit is "inactive".

When the substrate bias potential $V_{BB}$ rises and the potential of node n1 is pulled up to an H level, oscillator circuit 200 is activated to initiate oscillation, whereby charge pump circuit 200 is driven. In other words, the substrate potential generation circuit is "active", whereby substrate bias potential $V_{BB}$ begins to be lowered.

According to the above-described operation, the substrate bias potential is maintained at a predetermined potential.

The structure of the above-described substrate potential generation circuit is not sufficient by reasons set forth in the following when the substrate potential is greatly shifted to the negative side than the predetermined potential due to variation of the power supply potential.

When the substrate potential is shifted towards the negative side, the time constant T for that potential to be restored is T=R·C which is the product of capacitance C of a substrate and impedance R of a substrate. The value of the substrate impedance is generally great since it is determined by leakage current or the like of the pn junction formed at the substrate. This means that time constant T is also increased to result in a longer time period for the substrate potential to be restored.

Variation of the substrate potential will affect the threshold voltage of each transistor formed on the same substrate. It will directly influence the circuit operation characteristics, such as the operation margin. If the time required for the substrate potential to attain the stable state after variation is appreciable, the operation of each element formed on a substrate will become unstable.

A conventional substrate potential clamp circuit 400 for addressing this problem is shown in FIG. 19.

Referring to FIG. 19, a plurality of diode-connected n channel MOSFETs 402–408 are connected in series. These MOSFETs serve to couple the substrate with the ground potential. When the substrate potential become lower than $-4 \times V_{thn}$ where $V_{thn}$ is the threshold voltage of an n channel MOSFET, the substrate is connected to ground, whereby the substrate potential is pulled up. More specifically, the substrate potential greatly shifted towards the negative side is restored to $V_{BB}=-4 \times V_{thn}$ at a short time constant. Thus, this circuit includes the clamping function to suppress the absolute value of the substrate potential from exceeding $4 \times V_{thn}$.

Since the substrate potential directly affects the operation characteristics of circuitry, a stable value must be constantly maintained. It is necessary that the substrate potential generation circuit operates even during stand-by. In other words, power consumption of the substrate potential generation circuit is an important factor that determines the power consumption of the entire circuit during stand-by.

Particular attention must be paid in the case where a DRAM incorporated in a substrate potential generation circuit is operated by a battery.

In the substrate potential generation circuit of FIG. 18, oscillator circuit 200 consumes the greatest power. FIG. 20 shows a detail circuit diagram thereof.

At the first stage, a NAND circuit 202 receiving an output signal out4 of substrate potential detection circuit 100 (FIG.

18) is provided. A ring oscillator circuit is formed with an even number of stages of CMOS inverters connected.

The conventional substrate potential generation circuit of the above-described structure has problems set forth in the following.

Firstly, there was a problem that the power supply voltage dependency of the pull up current is great since p channel MOS transistor 102 having its gate potential grounded is used as the current supply circuit of the pull up side in substrate potential level detection circuit 100.

When the power supply voltage is increased to result in a greater pull up current, the level of the substrate potential at which oscillation circuit operation control signal out4, from substrate potential level detection circuit 100, switches becomes lower. Therefore, the absolute value of substrate potential $V_{BB}$ is increased together with the rise of the power supply voltage as shown by the dotted line of FIG. 17(A).

Secondly, the absolute value of the potential that causes switching of oscillation circuit operation control signal out4 (referred to as predetermined potential hereinafter) is reduced since the threshold voltage of the MOSFET determining the predetermined potential becomes lower in proportion to a rise in temperature. Therefore, the absolute value of the substrate potential controlled by the substrate potential generation circuit is reduced as the temperature becomes higher as shown in the dotted line in FIG. 17(B).

The third problem is that the operation of clamping the potential is too slow. This is because the current value flowing through the conventional clamp circuit changes its level in a relatively slow manner in the proximity of the threshold voltage at which a clamping operation is initiated when the substrate potential is greatly shifted towards the negative stop side than the predetermined potential. Control by the conventional clamp circuit is only effective when the difference between the predetermined potential and substrate potential is sufficient.

Thus, the conventional substrate potential generation circuit has the disadvantage that the controllability is poor with respect to variation in the external environment and external operation condition according to the above-described three points.

Fourthly, power consumption of the circuitry incorporating ring oscillator 200 is increased during stand-by since ring oscillator 200 consumes a great amount of current. Therefore, the operation margin is limited by external operation conditions such as the power source, or the operating condition of the mounted circuit is limited.

SUMMARY OF THE INVENTION

An object of the present invention is to provide a substrate potential generation circuit that can supply a stable substrate potential even when power supply voltage is varied.

Another object of the present invention is to provide a substrate potential generation circuit that can supply a stable substrate potential even when environment temperature changes.

A further object of the present invention is to provide a substrate potential generation circuit that can have consumption power during stand-by reduced.

According to an aspect of the present invention, a substrate potential generation circuit includes a first substrate potential level detection circuit, an oscillator circuit, and a charge pump.

The first substrate potential level detection circuit provides a first control signal according to a comparison result between a substrate potential and a first predetermined potential. The first substrate potential level detection circuit includes a first output node for providing a first control signal, a first input node coupled to a substrate potential, a first constant current generation circuit including at least a pair of MOS transistors forming a current mirror circuit, and having an output connected to the first output node, and a first MOSFET of a first conductivity type having a drain connected to the first output node, a gate coupled to a reference potential, and a source connected to the first input node.

The oscillator circuit is switched between an active state or an inactive state according to the first control signal. The charge pump circuit receive an output of the oscillator circuit to provide the substrate potential.

According to another aspect of the present invention, a substrate potential generation circuit includes a first substrate potential level detection circuit, an oscillator circuit, and a charge pump circuit.

The first substrate potential level detection circuit provides a first control signal according to a comparison result between a substrate potential and a first predetermined potential. The first substrate potential level detection circuit includes a first output node for providing the first control signal, a first input node coupled to the substrate potential, a first constant current generation circuit having at least a pair of MOS transistors forming current mirror circuit, and having an output connected to the first output node, a first MOSFET of a first conductivity type having a drain connected to the first output node, a gate coupled to the reference potential, and a source connected to the first input node, and at least one diode-connected MOSFET of the first conductivity type connected in series between the source of the first MOSFET of the first conductivity type and the first input node. The sum of the threshold value of the first MOSFET of the first conductivity type and the threshold value of the at least one MOSFET of the first conductivity type corresponds to a first detection potential. The oscillator circuit is switched between an active state and an inactive state according to the first control signal. The charge pump circuit receives an output of the oscillator circuit to provide the substrate potential.

In a substrate potential generation circuit according to another aspect of the present invention, the first constant current generation circuit preferably includes a first power source for supplying a first power supply potential, a second power source for supplying a second power supply potential, and a gate potential control circuit. The gate potential control circuit includes a constant current circuit having first to fourth input/output nodes wherein the first and second input/output nodes are connected to the first power source for maintaining the first current flowing across the first and third input/output nodes and the second current flowing across the second and fourth input/output nodes at equal levels, a second MOSFET of the second conductivity type having a source and a drain connected to a second power source and the third input/output node, and having a gate connected to the drain, a third MOSFET of the second conductivity type having a drain connected to the fourth input/output node, and having a greater value of a ratio of (the gate width/the gate length) than the second MOSFET of the second conductivity type, a first internal node to which the gates of the second and third MOSFETs of the second conductivity are commonly connected to each other, and a resister connected between the source of the third MOSFET of the second conductivity type and the second power source. The substrate potential generation circuit further includes a fourth MOSFET of the second conductivity type having a drain connected to the first output node, a source connected to the second power source, and a gate connected to the first internal node.

The main advantage of the present invention is that the substrate potential can be controlled stably at a first predetermined potential corresponding to the threshold value of the first MOSFET of the first conductivity type since the constant current source having a supply current that is not easily influenced by the power supply voltage is formed by a current mirror circuit.

Another advantage of the present invention is that the first predetermined potential can be grounded over a wider voltage range since the first predetermined potential corresponds to the sum of the threshold value of the first MOSFET of the first conductivity type and the at least one diode-connected MOSFET.

A further advantage of the present invention is that a structure is allowed in which a current value supplied by a first constant current generation circuit is independent of the power supply voltage and increases with respect to a rising temperature. Therefore, the first predetermined potential is not dependent upon the supply voltage and has a lower temperature dependency. Therefore, the substrate potential can be controlled stably.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a characteristic diagram showing an operation of a second embodiment.

DESCRIPTION OF THE PREFERRED EMBODIMENTS

First Embodiment

Figure 1:
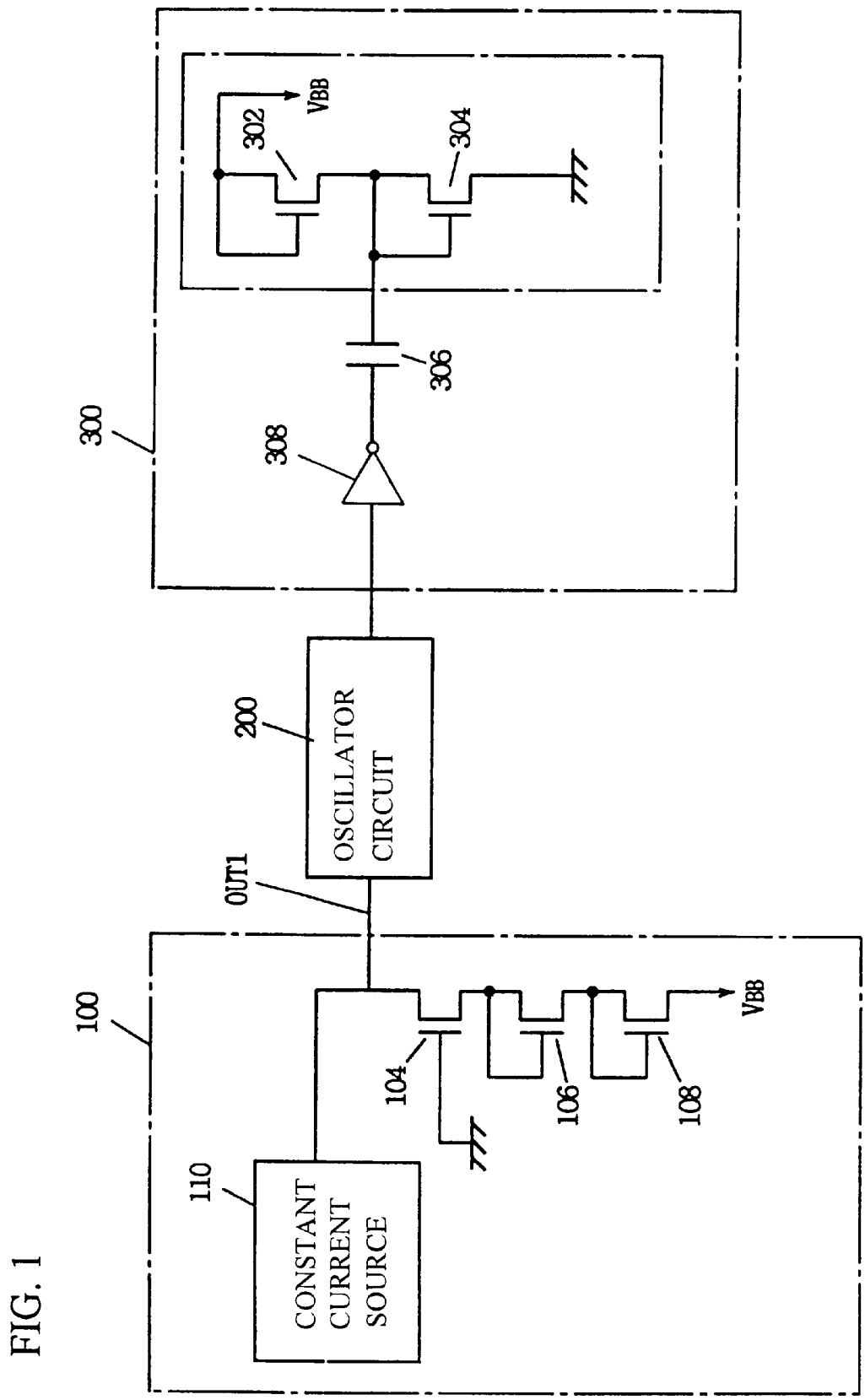
FIG. 1 is a schematic block diagram showing a structure of a first embodiment of the present invention.

FIG. 1 is a schematic block diagram showing a structure of a substrate potential generation circuit according to a first embodiment of the present invention.

Figure 18:
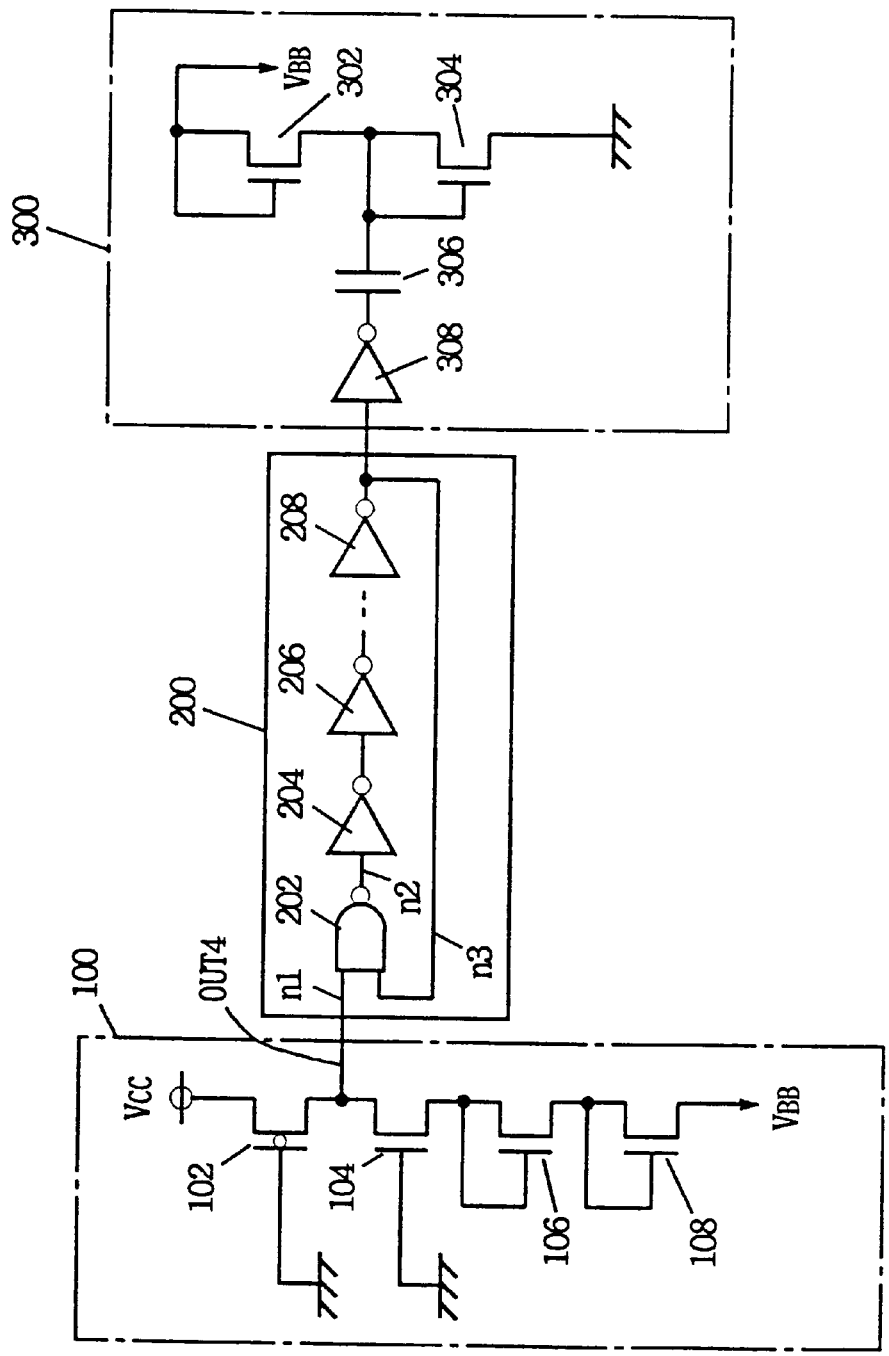
FIG. 18 is a schematic block diagram showing a structure of a conventional substrate potential generation circuit.
Figure 19:
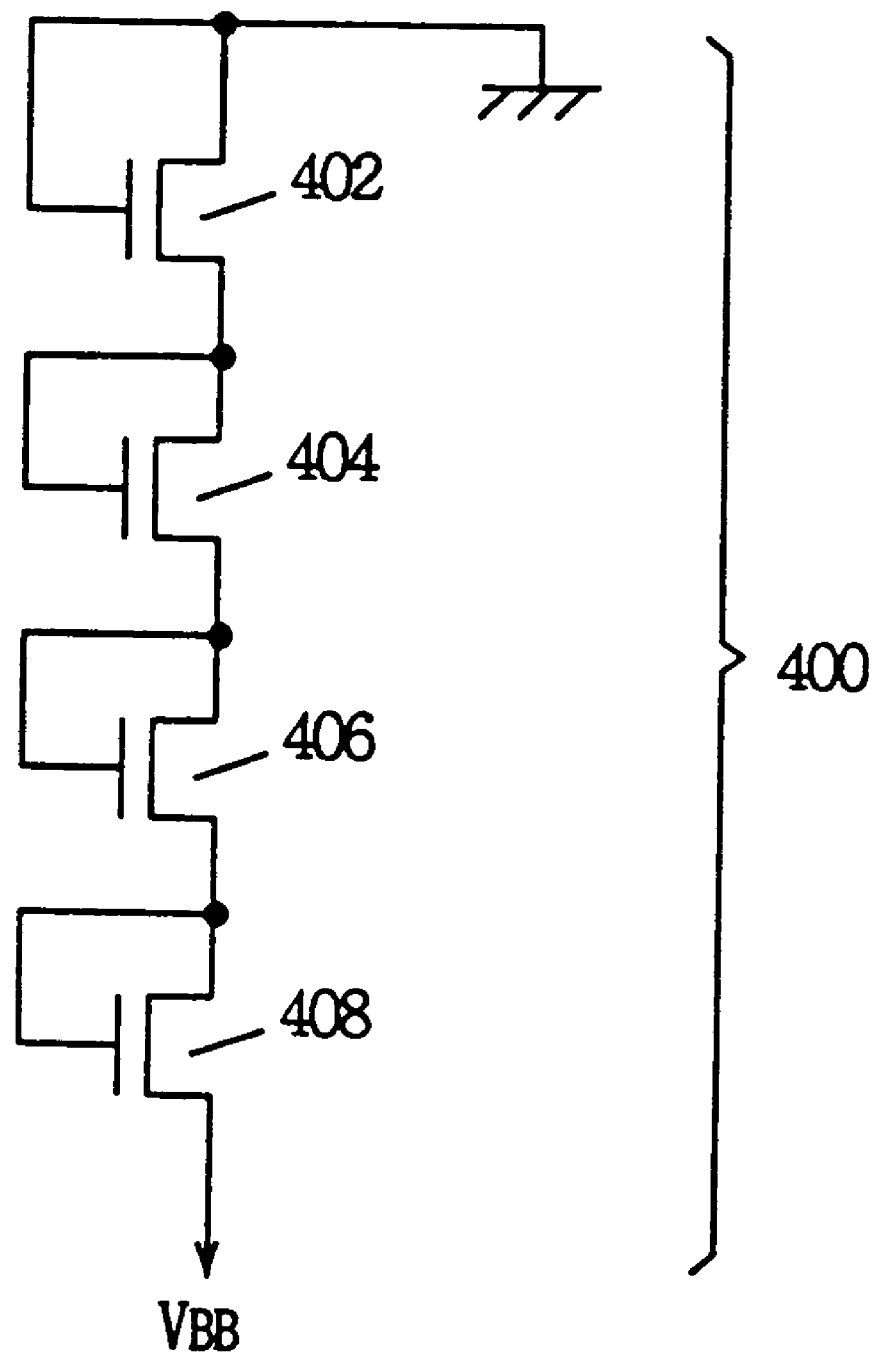
FIG. 19 is a circuit diagram showing a conventional clamp circuit.

In the drawing, oscillator circuit 200 and charge pump circuit 300 are similar to those of the prior art shown in FIG. 18.

The only difference from the conventional implement is that the power source supplying current to n channel MOSFETs 104, 106 and 108 in substrate potential level detection circuit 100 is substituted by a constant current source 110 including MOSFETs (not shown) forming a current mirror circuit.

Figure 2:
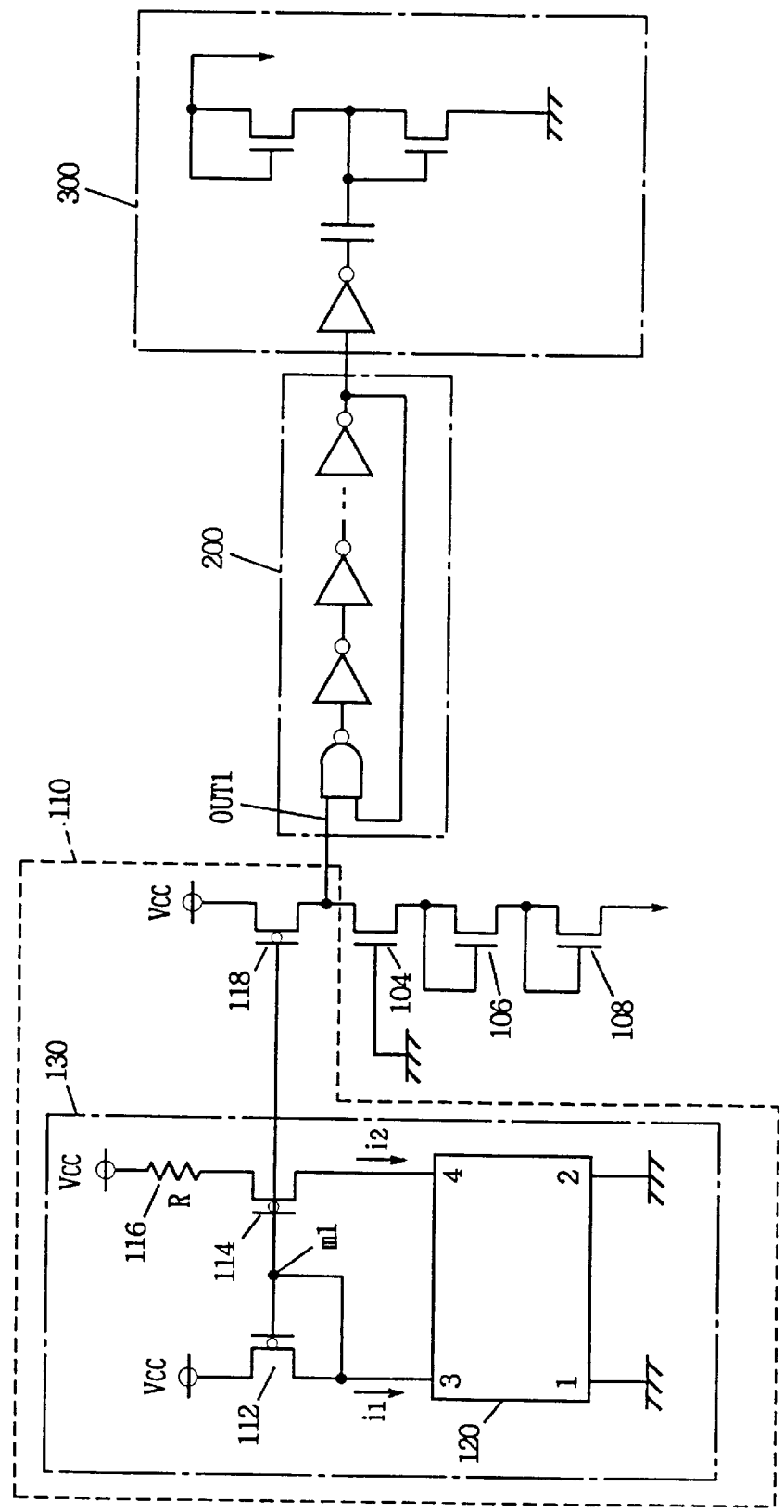
FIG. 2 is a schematic block diagram showing in more detail the structure of a constant current generation circuit of the first embodiment.

FIG. 2 is a block diagram showing in detail a structure of a first embodiment. Referring to FIG. 2, constant current source 110 includes a p channel MOSFET 118 and gate potential control circuit 130. Gate potential control circuit 130 includes a constant current circuit 120.

Constant current circuit 120 maintains a current $i_1$ flowing across nodes 1 and 3 and a current $i_2$ flowing across nodes 2 and 3 at equal levels.

The gate and the drain of p channel MOSFET 112 are diode-connected. Transistor 112 and p channel MOSFET 118 form a current mirror circuit.

The current flowing across p channel MOSFET 118 becomes an output of constant current source 110.

As to p channel MOSFET 112 and p channel MOSFET 114 having the gates connected in common, the value of the ratio of the gate width/gate length of p channel MOSFET 114 is set greater by one order of magnitude. The source of p channel MOSFET 114 is connected to a power source (voltage: $V_{CC}$) via a resistor 116 of a resistance R.

Figure 3:
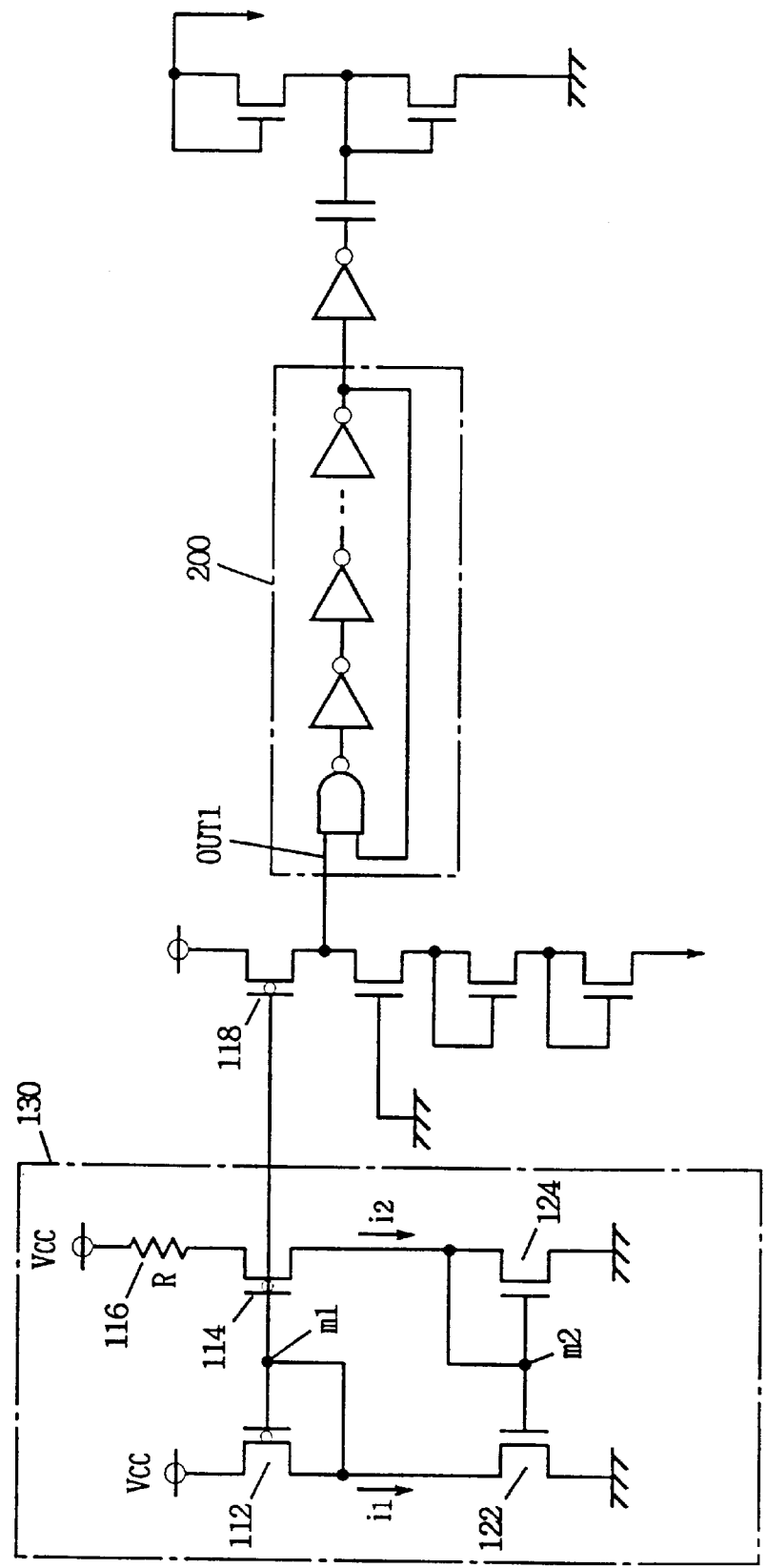
FIG. 3 is a schematic block diagram showing a modification of the first embodiment.

Constant current circuit 120 can be a current mirror circuit formed of n channel MOSFETs 122 and 124 as shown in FIG. 3. The present invention is not limited to this circuit structure, and any structure can be employed as long as there is a function to maintain the current flowing across nodes 1 and 3 and the current flowing across nodes 2 and 4 at equal levels.

An operation of gate potential control circuit 130 will be described briefly hereinafter with reference to FIGS. 4A and 4B.

Figure 4B:
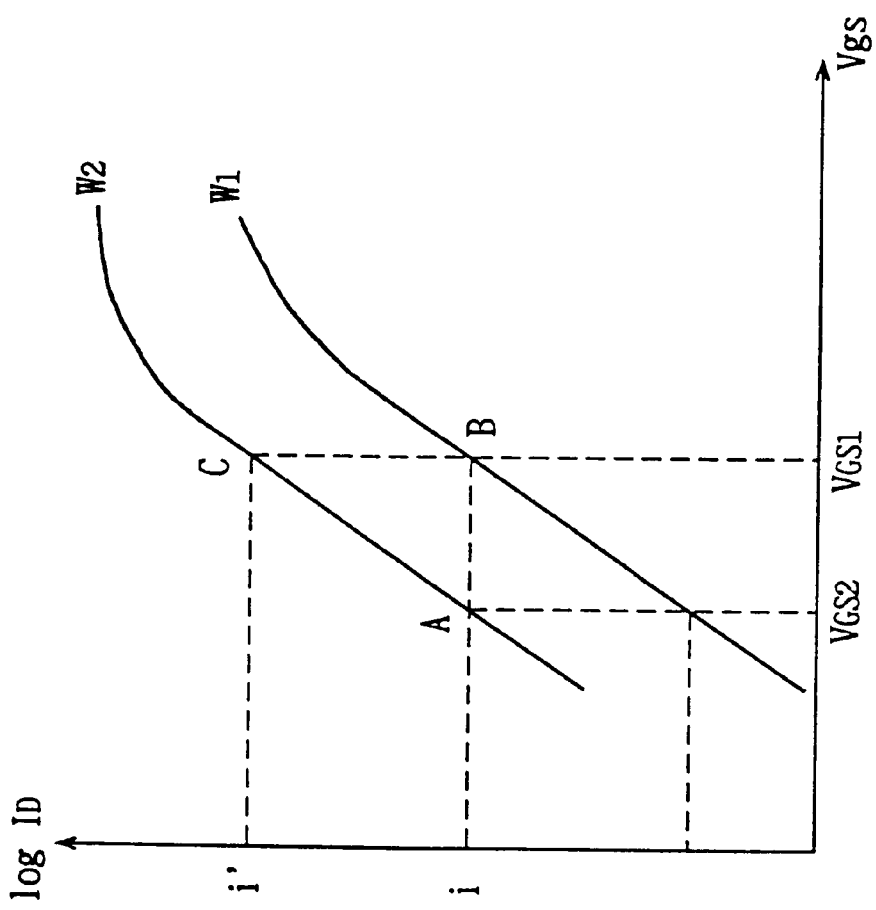
FIG. 4B is a characteristic diagram showing an operation point of a transistor.
Figure 4A:
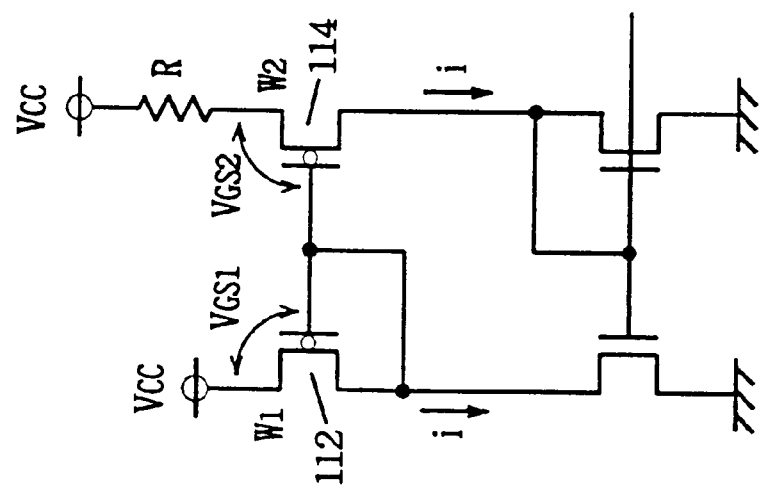
FIG. 4A is a circuit diagram for describing an operation of the constant current generation circuit of the first embodiment.

Since the value of the current flowing across p channel MOSFET 112 is equal to that flowing across MOSFET 114 as shown in FIG. 4A, this current value is set as i.

The gate-source voltage of p channel MOSFET 112 is $V_{GS1}$ and the gate-source voltage of P channel MOSFET 114 is $V_{GS2}$ when current i is conducted.

In the following description, it is assumed that these transistors have the same gate length, and the gate width of p channel MOSFETs 112 and 114 are $W_1$ and $W_2$, respectively.

Therefore, the drain current is simply proportional to the ratio of the gate widths when the gate-source voltages of both transistors equal each other.

FIG. 4B is a semi-log plot showing the gate-source voltage VGS dependency of drain current $I_D$ of p channel MOSFETs 112 and 114.

The plot of $V_{GS}-\log_{10} I_n$ is linear in the sub threshold region. This gradient of the straight line is called a sub threshold swing S.

More specifically, S is the voltage required for the drain current to be varied by one order of magnitude.

The relationship between current i and a circuit parameter is set forth in the following.

Since $V_{GS2}$ has a smaller voltage drop by resistance R in comparison with $V_{GS1}$, the following equation is established.

$$V_{GS2} = V_{GS1} - R \cdot i \qquad (2)$$

Therefore, the potential difference between AB in FIG. 4B is R·i.

Assuming that the drain current is i' when gate-source voltage $V_{GS1}$ is applied to p channel MOSFET 114, the drain current is proportional to the gate width. Therefore, the following equation is established.

$$\log i' - \log i = \log (i'/i) = \log (W_2/W_1) \qquad (3)$$

More specifically, the difference in the logarithm value of the current between BC in FIG. 4B is a constant independent of the operating point of p channel MOSFETs 112 and 114.

According to equations (2) and (3) and the definition of subthreshold swing S, the following equation is established.

$$\begin{aligned} S &= (V_{GS1} - V_{GS2})/(\log i' - \log i) \qquad (4) \\ &= Ri/\log(W_2/W_1) \end{aligned}$$

A modification of this equation results in the relationship of:

$$i = (S/R) \log (W_2/W_1) \qquad (5)$$

From the above, it is appreciated that current i is characteristic of the following two points.

Firstly, current i is dependent only on the dimension of the transistor, the subthreshold characteristic, and the resistance of the resistor. It is independent of the power supply voltage.

Secondly, current i increases in proportion to the temperature since S is generally increased in proportion to temperature T.

From the above two features, substrate potential level detection circuit 100 exhibits the following characteristics when constant current source 110 is used.

i) The potential level at which output signal out1 of the substrate potential level detection signal 100 switches is not dependent upon the power supply voltage. This is because the current flowing across p channel MOSFET 118 does not change in response to the power supply voltage.

ii) The temperature dependency of the potential which output signal out1 is switched is reduced. Since the threshold value of n channel MOSFETs 104, 106 and 108 becomes smaller as the temperature becomes higher, the switching level of signal out1 is increased towards a higher level. In contrast, current i flowing across p channel MOSFET 118 is increased as the temperature becomes higher, so that the switching level of signal out1 is reduced to a lower level. Therefore, the influence of the respective tendency cancel each other.

Figure 17A:
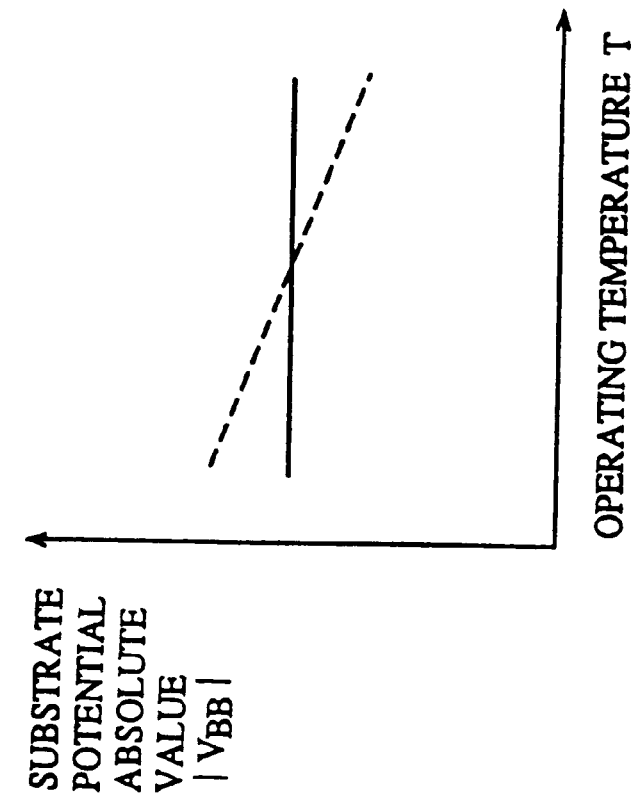
FIGS. 17A and 17B are characteristic diagrams showing the power supply voltage dependency and the operating temperature dependency, respectively, of the absolute value of the substrate potential.
Figure 17B:
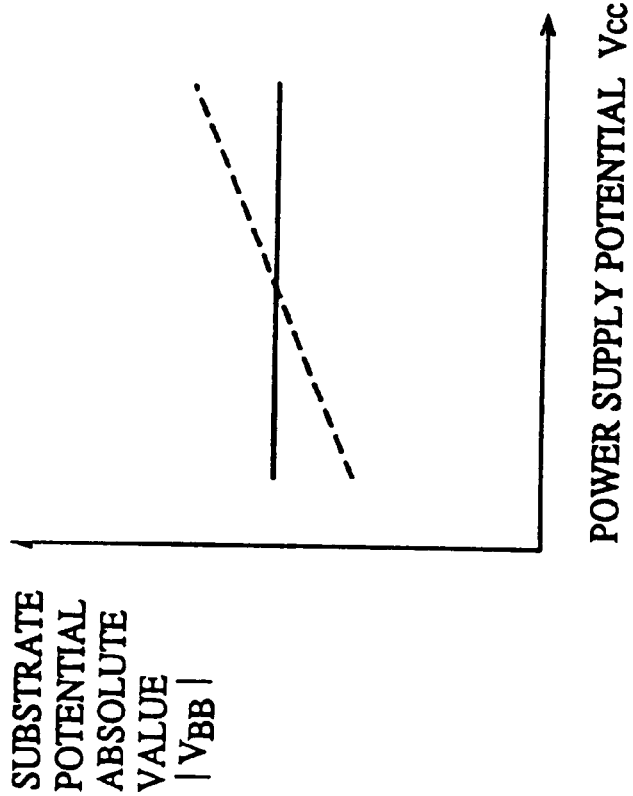

The $V_{CC}-|V_{BB}|$ characteristic and the $T-|V_{BB}|$ characteristic using constant current source 110 in substrate potential level detection circuit 100 are shown by the solid lines in FIGS. 17A and 17B in comparison with the conventional implement. It is appreciated from FIGS. 17A and 17B that a stable substrate potential can be supplied with respect to variation in the external condition in the present embodiment in comparison with the characteristics of the conventional case indicated by the dotted line.

Second Embodiment

Figure 5:
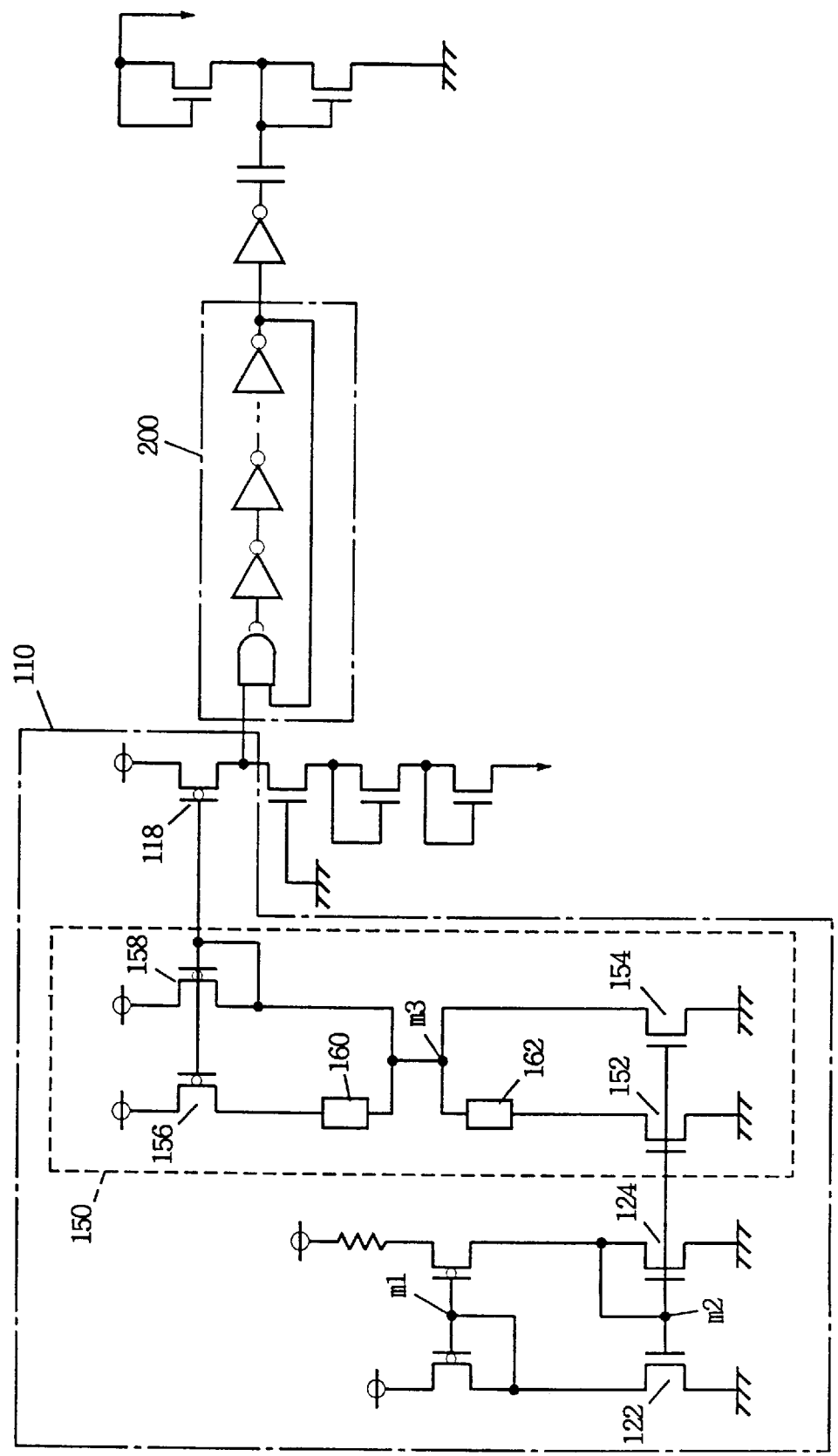
FIG. 5 is a schematic block diagram showing a second embodiment of the present invention.

FIG. 5 is a schematic block diagram showing a structure of a substrate potential generation circuit according to a second embodiment of the present invention.

The substrate potential generation circuit of the second embodiment differs from the substrate potential generation circuit of the first embodiment in that a mirror ratio conversion circuit 150 is provided in constant current source 110.

Mirror ratio conversion circuit 150 includes a set of parallel n channel MOSFETs 152 and 154 having the sources grounded, and a set of parallel p channel MOSFETs 156 and 158 having the sources connected to the power source. The gates of n channel MOSFETs 152 and 154 are connected in common to the gates of n channel MOSFETs 122 and 124. These transistors form a current mirror circuit.

The gate and drain of p channel MOSFET 158 are diode-connected. This FET 158 and p channel MOSFETs 156 and 158 form a current mirror circuit.

The drains of n channel MOSFETs 152 and 154 and p channel MOSFETs 156 and 158 are connected to a common node m3. In the present embodiment, a nonvolatile switching element that can render the connection of p channel MOSFET 156 and n channel MOSFET 152 with node m3 conductive or non-conductive, for example, fuse elements 160 and 162 that can set a non-conductive state by laser trimming, are provided. The output current of constant current source 110 can be modified by trimming fuse elements 160 and 162. It is therefore possible to change the predetermined potential level at which output signal out1 of substrate potential detection circuit 100 is switched. This feature allows the value of the substrate potential to be changed that is generated and controlled by the substrate potential generation circuit.

The relationship between the disconnected/connected state of fuse elements 160 and 162 and the absolute value of substrate potential $V_{BB}$ is shown in FIG. 6. In the event that both fuse elements are conductive initially, the transition of fuse element 160 to a non-conductive state causes two times the current to flow to p channel MOSFET 118. This current will be conducted to n channel MOSFETs 104, 106 and 108. Therefore, the absolute value of substrate potential $V_{BB}$ becomes greater since signal out1 is switched when the substrate potential $V_{BB}$ attains a lower level.

When fuse element 162 is rendered non-conductive, the current flowing to p channel MOSFET 118 is halved, whereby $|V_{BB}|$ becomes smaller.

Since the value of substrate potential $V_{BB}$ can be changed by trimming the fuse element, the value of a substrate potential offset from a designed value due to variation in the element characteristic during the manufacturing process can be corrected.

The invention is not limited to the present embodiment in which mirror ratio conversion circuit 150 is formed of two n channel MOSFETs and two p channel MOSFETs. By increasing the number of the MOSFETs, the substrate potential can be altered in more fine steps.

Third Embodiment

The second embodiment shows a case where the set value of the substrate potential can be modified by trimming a fuse element. However, it is difficult to restore the fuse element when once trimmed if nonvolatile switching means 160 and 162 are used. The present third embodiment includes a p channel MOSFET 164 and an n channel MOSFET 166 to allow verification of a substrate potential after trimming by obtaining an effect equal to that of the fuse cut before the fuse is actually cut off. In a normal state, transistors 164 and 166 are turned on. Trimming is carried out in a pseudo manner by turning off the transistor.

Figure 8:
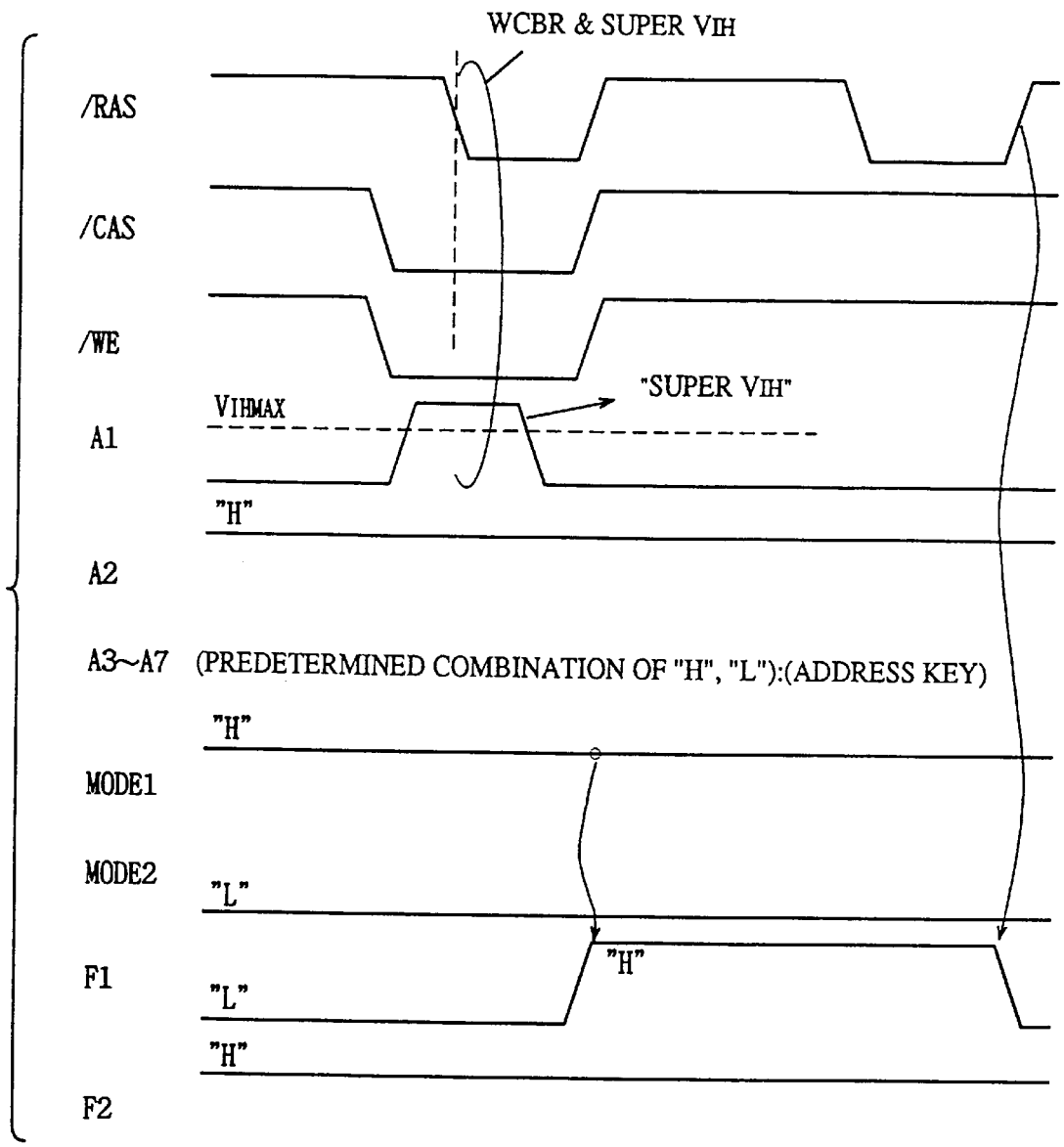
FIG. 8 is a wave form diagram showing an operation of the third embodiment.

FIG. 8 shows an example of pseudo trimming in a DRAM using an external signal. In the state where a column strobe signal /CAS and a write enable signal /WE both attain an L level, address pin A1 receives a voltage higher than the input maximum specification value ($V_{IHMAX}$) of an H level, address pin A2 attains an H level, and address pins A3–A7 attain a predetermined combination of H and L levels (address key) at a following edge of a row strobe signal /RAS to an L level.

After the satisfaction of the above condition, a pseudo trimming mode is entered at a following rising edge of /RAS signal to an H level. This pseudo trimming mode is maintained until the refresh of signal /RAS is completed (the operation of signal /RAS rendered H→L→H while signal /CAS is H).

During a pseudo trimming mode, the signal MODE1 is provided to F1, or signal MODE2 which is an inverted signal thereof is provided to F2. In this case, MODE1 =H and MODE2 =L, so that F1=H and F2=H. Here, fuse element 160 is cut off in a pseudo manner since transistor 164 is turned off.

Fourth and Fifth Embodiments

In the second and third embodiments, gate potential control circuit 130 was used in constant current source 110 within substrate potential level detection circuit 100. The configuration of this circuit is not limited to the above. The circuit shown in FIG. 9 and disclosed in Japanese Patent Laying-Open No. 4-6694 can be used as the gate potential control circuit in the fourth embodiment.

In this case, current i flowing though the current mirror circuit of n channel MOSFETs 122 and 124 is:

$$i = R/V_{thp} \tag{6}$$

where $V_{thp}$ is threshold value of p channel MOSFET 112 and R is the resistance of the resistor.

Figure 7:
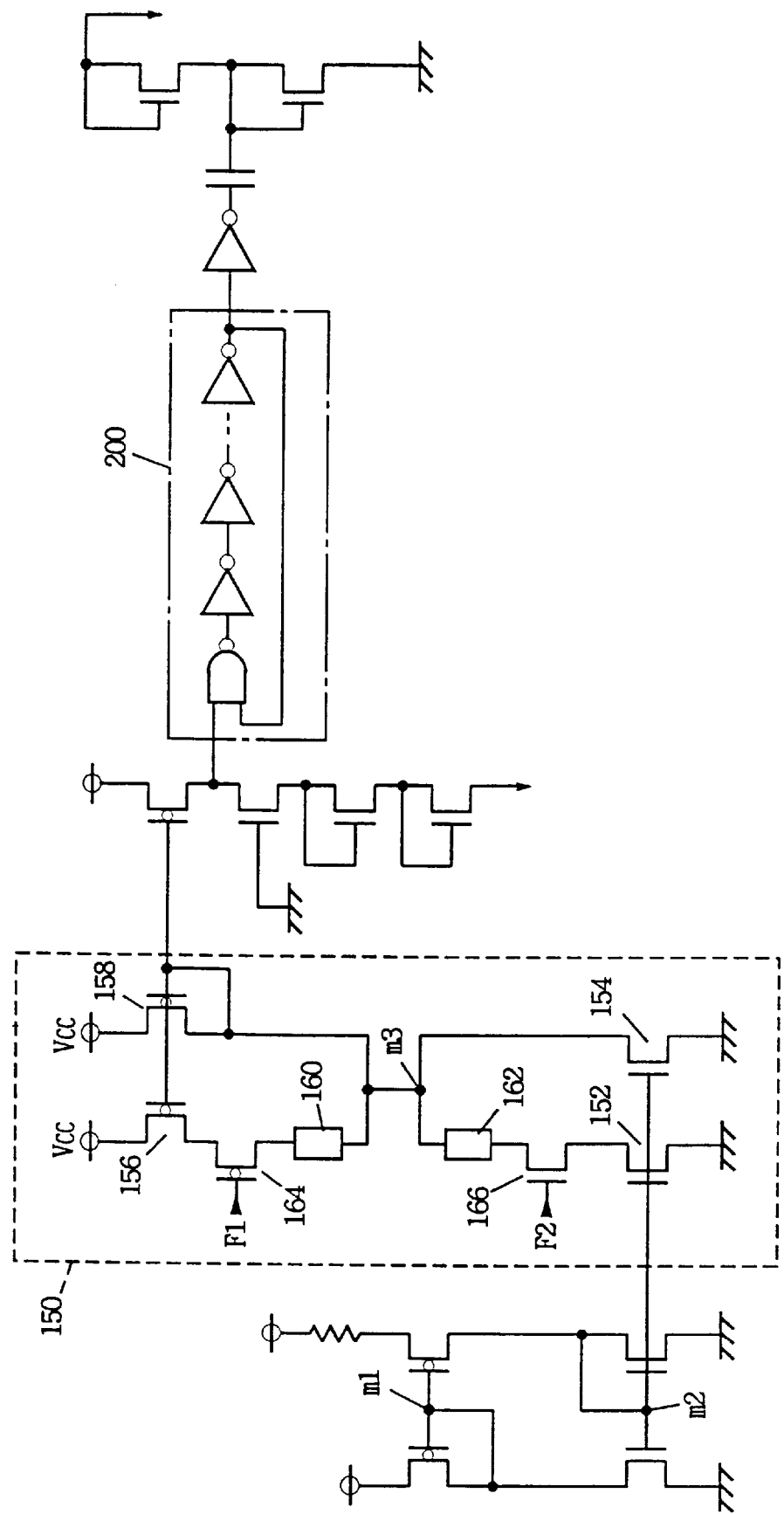
FIG. 7 is a schematic block diagram showing a third embodiment of the present invention.

An operation similar to that of the third embodiment can be implemented by connecting node m2 with the gates of transistors 152 and 154 (FIG. 7).

Figure 9:
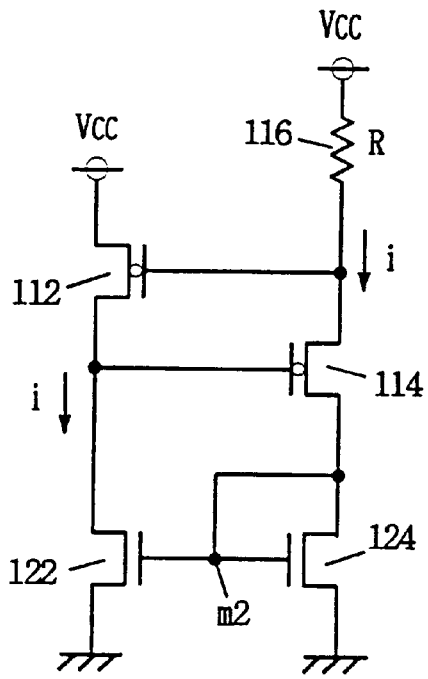
FIG. 9 is a circuit diagram showing a constant current generation circuit of a fourth embodiment of the present invention.
Figure 10:
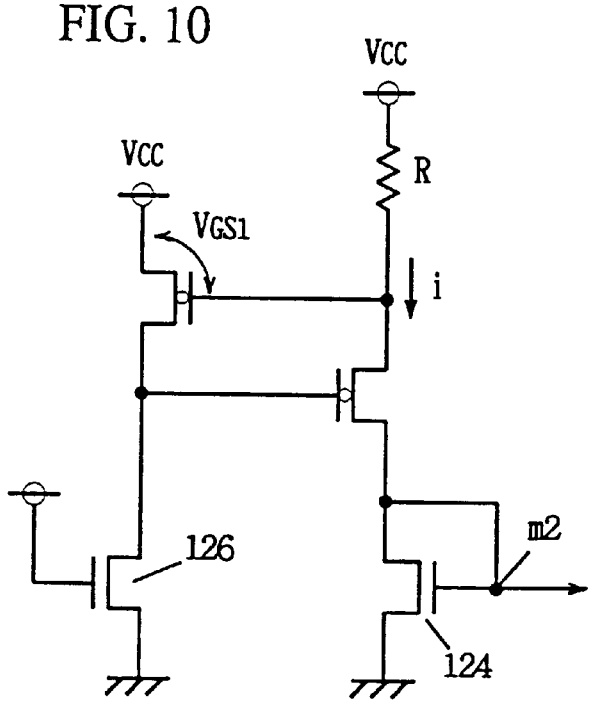
FIG. 10 is a circuit diagram of a constant current generation circuit according to a fifth embodiment of the present invention.

The fifth embodiment of the present invention employs the circuit shown in FIG. 10 as gate potential control circuit 130. This circuit has the set of transistors 122 and 124 forming a current mirror circuit in FIG. 9 substituted with the set of an n MOSFET 126 having a gate length longer than that of transistor 124, and operating as a current source with the gate potential equal to the power supply potential, and diode-connected n channel MOSFET 124.

A greater length of the gate of transistor 126 results in a higher threshold value, so that p channel MOSFET 112 operates in the vicinity of the subthreshold region (for example, $I_D$: several $\mu$A). Therefore, the gate-source voltage $V_{GS1}$ is:

$$V_{GS1} \approx V_{thp} \tag{7}$$

where $V_{thp}$ is the threshold value of transistor 112. Since the voltage across both ends of resistor 116 in this circuit is also $V_{thp}$, the current flowing to transistor 124 is:

$$i = R/V_{thp} \tag{6'}$$

which is similar to that of FIG. 9. Thus, an operation similar to that of the third embodiment can be obtained by connecting node m2 and the gates of transistors 152 and 154 (FIG. 7).

It is to be noted that in the present fourth and fifth embodiments, reduction in $V_{thp}$ due to a higher temperature causes current value i to be lowered since the current value is represented by equations (6) and (6'). Therefore, the temperature dependency of the voltage which output signal out1 of the substrate potential level detection circuit 100 is switched is superior than that of the first embodiment shown in FIG. 3.

Sixth Embodiment

Figure 11:
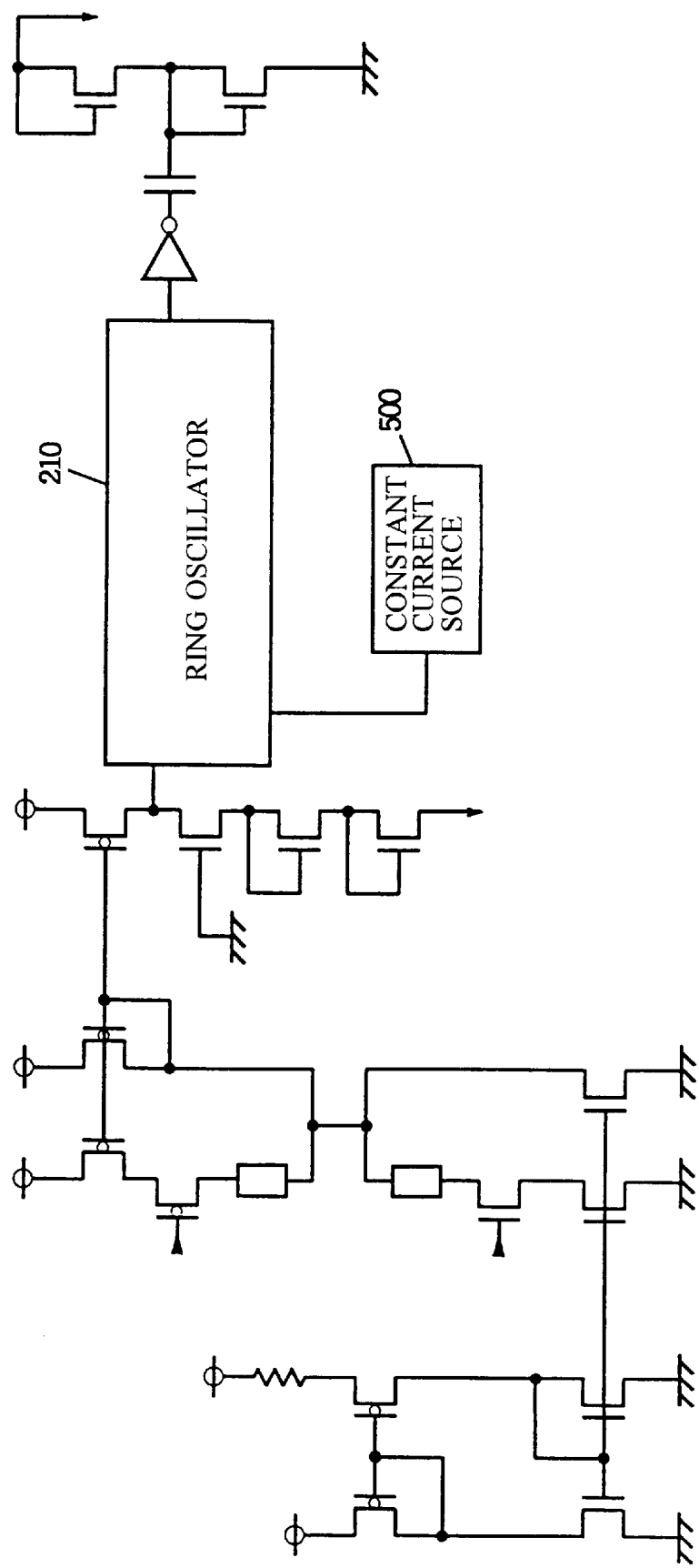
FIG. 11 is schematic block diagram showing a sixth embodiment of the present invention.

FIG. 11 is a schematic block diagram showing a structure of a substrate potential generation circuit according to a sixth embodiment of the present invention.

The first feature of the sixth embodiment differs from the third embodiment in that a second constant current source 500 including a current mirror circuit is connected to a ring oscillator 210.

Figure 12:
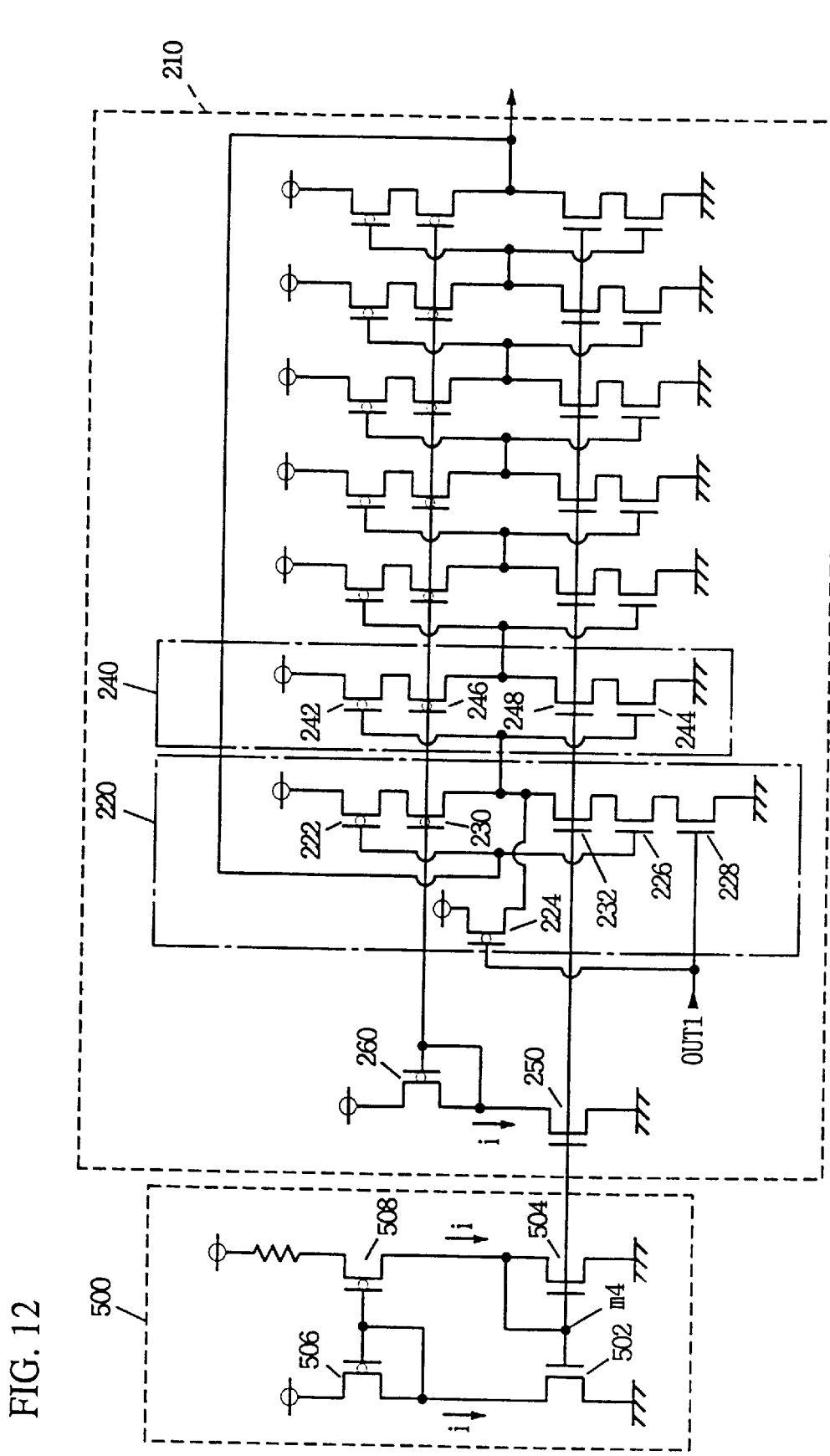
FIG. 12 is a circuit diagram showing in detail an oscillator circuit according to the sixth embodiment.

FIG. 12 is the circuit diagram showing in detail ring oscillator circuit 210 and constant current source 500 of the sixth embodiment.

Figure 20:
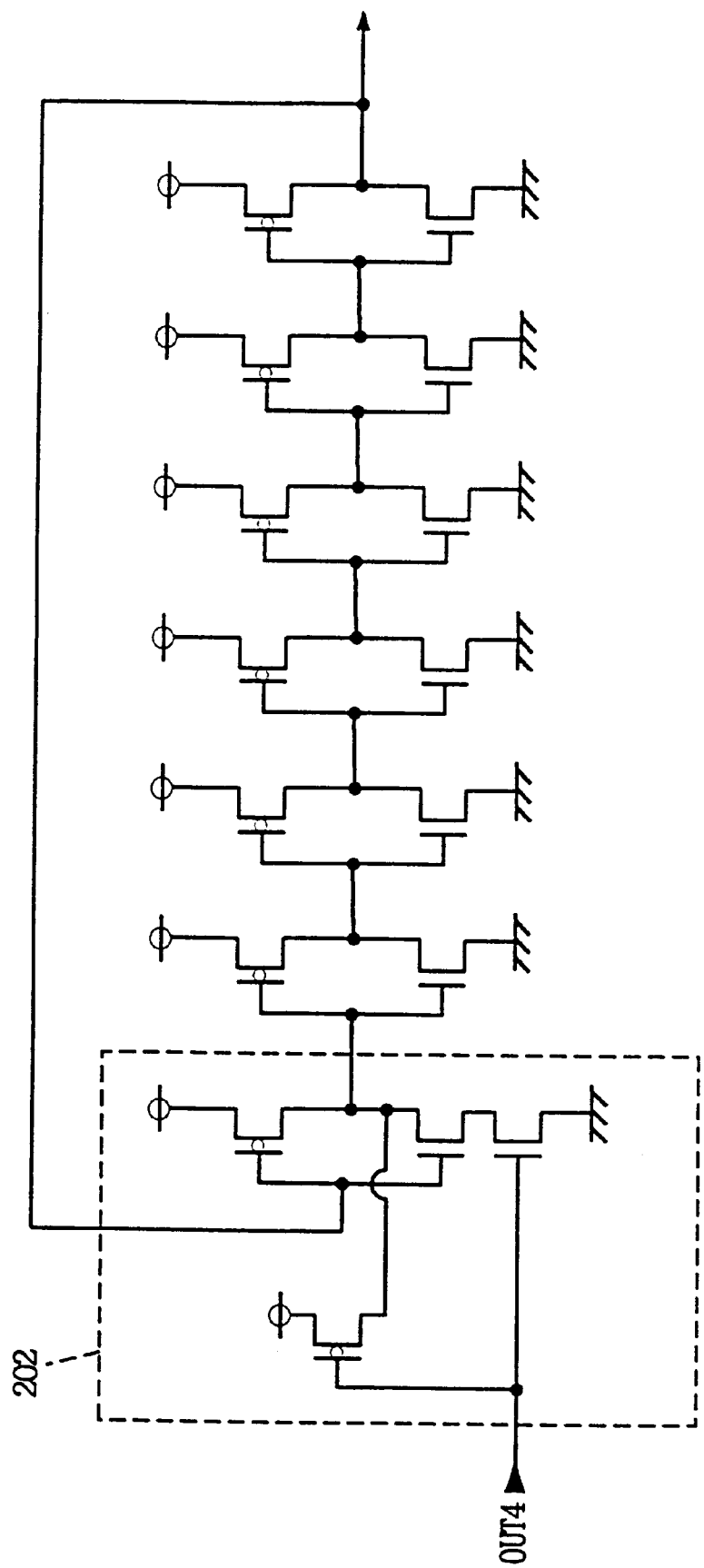
FIG. 20 is a circuit diagram showing a conventional oscillator circuit.

The circuitry of the sixth embodiment differs from the conventional ring oscillator circuit 200 shown in FIG. 20 in that the gates of n channel MOSFET 232 in NAND circuit 220 and n channel MOSFET 248 in inverter circuit 240 are connected in common to node m4 that connects the gate electrodes of n channel MOSFETs 502 and 504 forming a current mirror circuit in constant current source 500 together to form a current mirror circuit as a whole. Furthermore, the gates of p channel MOSFET 260, p channel MOSFET 230 in NAND circuit 220, and p channel MOSFET 246 in inverter circuit 240 are connected in common, all which form a current mirror circuit as a whole.

The value of the current flowing to p channel MOSFET 260 is equal to the current value i flowing to MOSFET 250, i.e., n channel MOSFET 504 of the constant current circuit.

Therefore, the maximum value of the current flowing through NAND circuit 220 and inverter circuit 240 is limited to current value i.

Generally, a through current flows in an CMOS circuit during a switching operation of NAND circuit 220 and inverter 240. This through current determines the consumption power of oscillator circuit 210. Since the value of the through current is limited to current value i, consumption power is suppressed.

Seventh Embodiment

Figure 13:
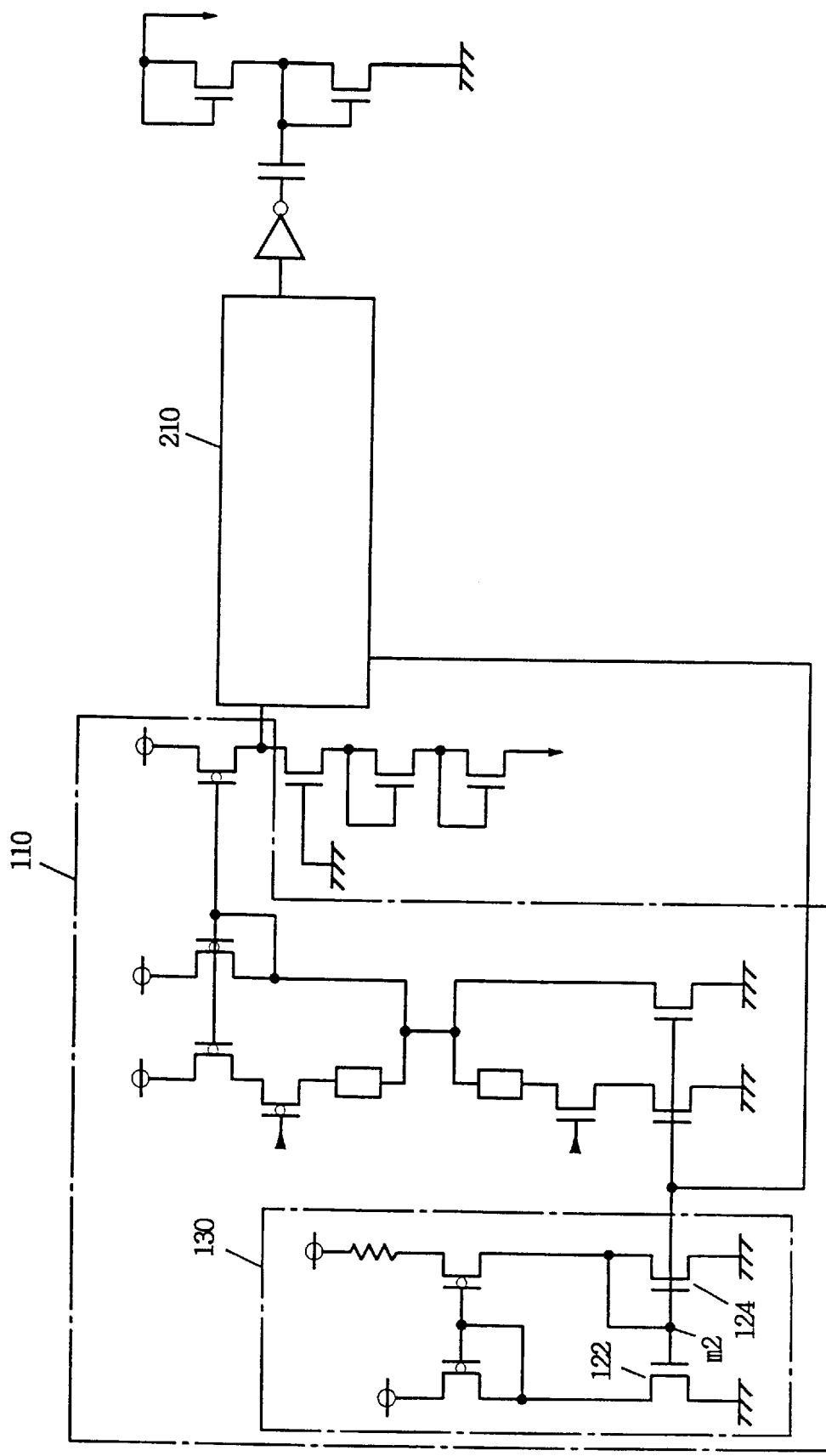
FIGS. 13 and 14 are schematic block diagrams showing a seventh embodiment and an eighth embodiment, respectively, of the present invention.

FIG. 13 is a block diagram schematically showing a structure of a substrate potential generation circuit according to a seventh embodiment of the present invention.

The substrate potential generation circuit of the seventh embodiment differs from the substrate potential generation circuit of FIG. 6 in that a structure is provided including a constant current source 110 which is common to constant current source 500. More specifically, internal node m2 in gate potential control circuit 130 in constant current source 110 is connected to the gate of n channel MOSFET 250 (FIG. 12) in oscillator circuit 210.

According to the present invention, a function similar to that of the sixth embodiment can be realized without a new constant current source.

Eighth Embodiment

As described before, a substrate potential generation circuit must include a clamping function of a substrate potential in order to compensate for a great shift of the substrate potential to the negative side caused by various external factors.

Figure 14:
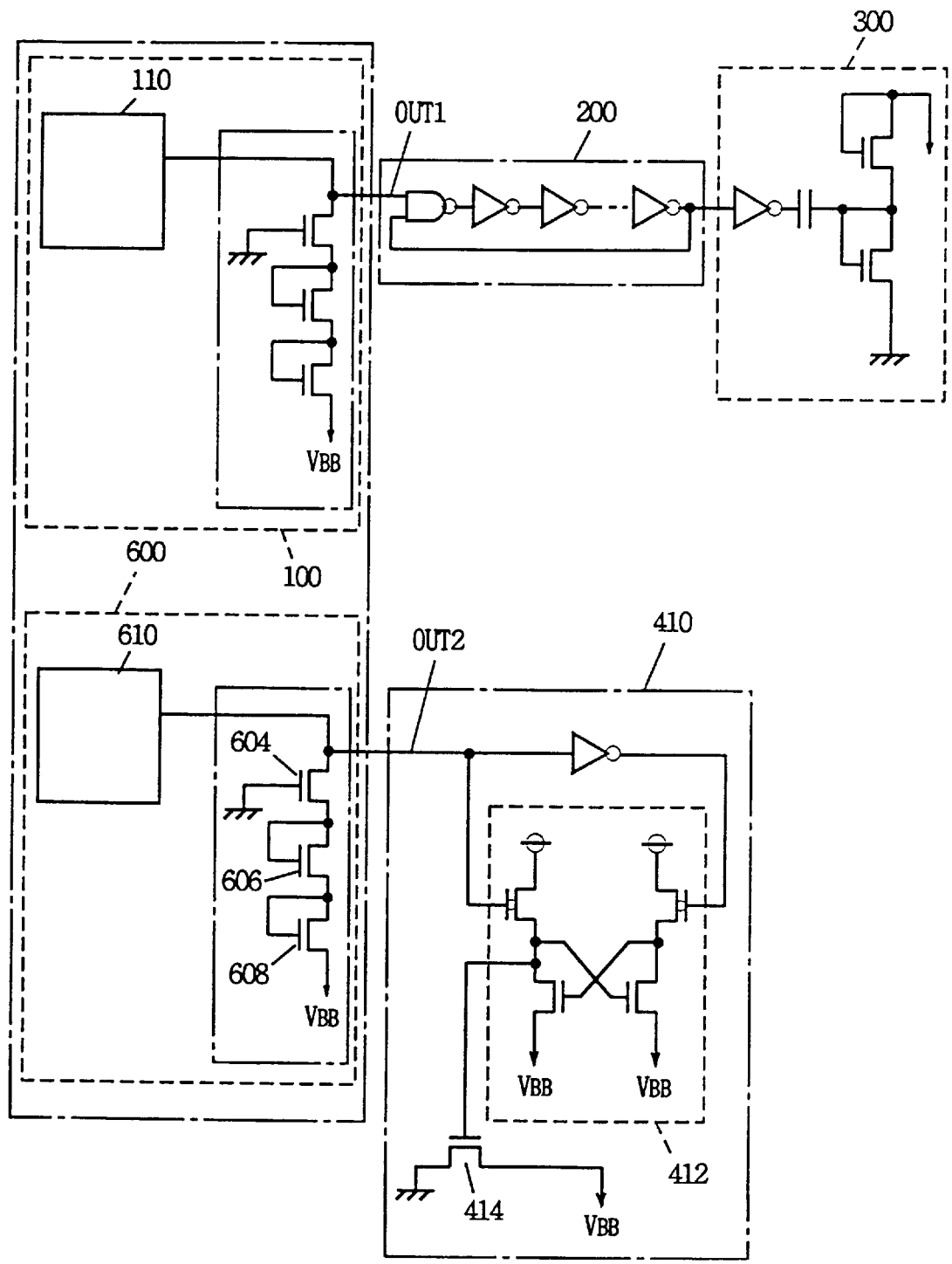

FIG. 14 is a schematic block diagram showing a structure of a substrate potential generation circuit including a clamp function according to an eighth embodiment of the present invention.

The substrate potential generation circuit of the eighth embodiment differs from the substrate potential generation circuit of the first embodiment in that a second substrate potential level detection circuit 600 including a constant current 610 is provided. The operation of a clamp circuit 410 is controlled according to an output signal out2 thereof.

It is assumed that n channel MOSFETs 104, 106 and 108 in substrate potential level detection circuit 100 and n channel MOSFETs 604, 606, and 608 in substrate potential level detection circuit 600 all have the same size with $i_A$ as the pull down current value thereof.

It is assumed that $I_1 < I_2$ where $I_1$ is the value of the current supplied from constant current source 110 and $I_2$ is the value of the current supplied from constant current source 610.

Figure 15:
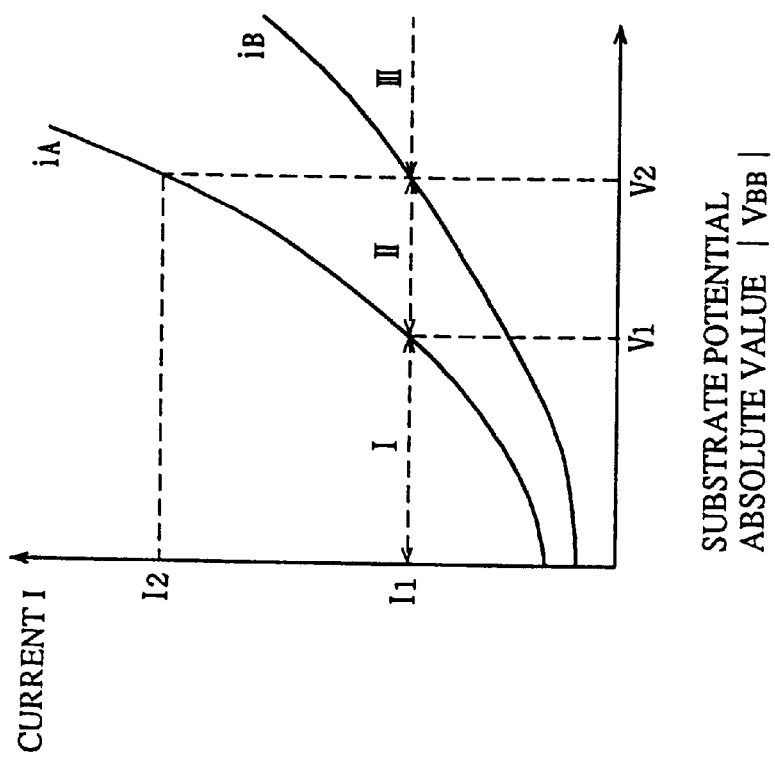
FIG. 15A is a characteristic diagram showing an operation point of a transistor according to the eighth embodiment.
FIG. 15B is a diagram showing the correspondence between the substrate potential and a level determination signal according to the eighth embodiment.

FIG. 15A is a graph showing the relationship between pull down current $i_A$ and the absolute value of substrate potential $V_{BB}$. Assuming that $V_1$ is the absolute value of the substrate potential where constant current value $I_1$ equals $i_A$ and $V_2$ is the absolute of the substrate potential where current value $I_2$ equals $i_A$, the relationship of $V_1 < V_2$ is established.

In this case, output signal out1 of substrate potential level detection circuit 100 switches between the H level and the L level at potential $V_1$, and output signal out2 of substrate potential level detection circuit 600 switches between the H level and L level at potential $V_2$ as shown in FIG. 15B.

Therefore, charge pump circuit 300 is rendered active when $|V_{BB}| < V_1$ and inactive when $|V_{BB}| > V_1$ with respect to first predetermined potential $V_1$.

The clamp circuit disclosed in Japanese Patent Laying-Open No. 4-753 may be used as clamp circuit 410.

An operation of clamp circuit 410 will be described hereinafter with reference to FIG. 14. When signal out2 attains an L level, the gate potential of transistor 414 is driven to the level of power supply potential $V_{CC}$ by level conversion circuit 412. Therefore, substrate potential $V_{BB}$ is clamped to the level of the ground potential. When the absolute value of substrate potential $V_{BB}$ becomes smaller than the second predetermined potential $V_2$, signal out2 attains an H level.

Then, the gate potential of transistor 414 is driven to the level of substrate potential $V_{BB}$ by level conversion circuit 412, whereby transistor 414 is turned on to inhibit the clamping operation.

Since the gate potential of transistor 414 is abruptly switched to the level of $V_{CC}$ or $V_{BB}$, transistor 414 is either completely turned on or turned off. Therefore, the switching gain is great.

The invention is not limited to the above-described structure as long as clamp circuit 410 switches the connection of the potential having an absolute value smaller than that of the second predetermined potential and the substrate to a non-conductive state or a conductive state according to signal out2.

An operation of the entire circuitry of the eighth embodiment will be described with reference to FIGS. 15A and 15B.

In the region I where the absolute value of substrate potential $V_{BB}$ is smaller than first predetermined voltage $V_1$ and where signals out1 and out2 both attain an H level, charge pump circuit 300 is active and clamp circuit 410 is inactive. Therefore, substrate potential $V_{BB}$ is lowered, and the absolute value thereof is increased.

In the region II where the absolute value of substrate potential $V_{BB}$ is greater than first predetermined voltage $V_1$ and smaller than second predetermined potential $V_2$, signal out1 attains an L level and signal out2 attains an H level. Therefore, charge pump circuit 300 is inactive, and clamp circuit 410 also stops. Therefore, substrate potential $V_{BB}$ is gradually increased at time constant T.

In the region III where the absolute value of substrate potential $V_{BB}$ is greater than second predetermined potential $V_2$, signals out1 and out2 both attain an L level. Therefore, charge pump circuit 300 is inactive, and clamp circuit 410 attains an operating state. Therefore, substrate potential $V_{BB}$ will increase at a relatively short time constant until the absolute value thereof attains the level of second predetermined voltage $V_2$.

In the substrate potential generation circuit of the eighth embodiment, the clamping function is demonstrated explicitly when the substrate potential is greatly offset towards the negative side. The controllability of the substrate potential is improved.

Ninth Embodiment

Figure 16:
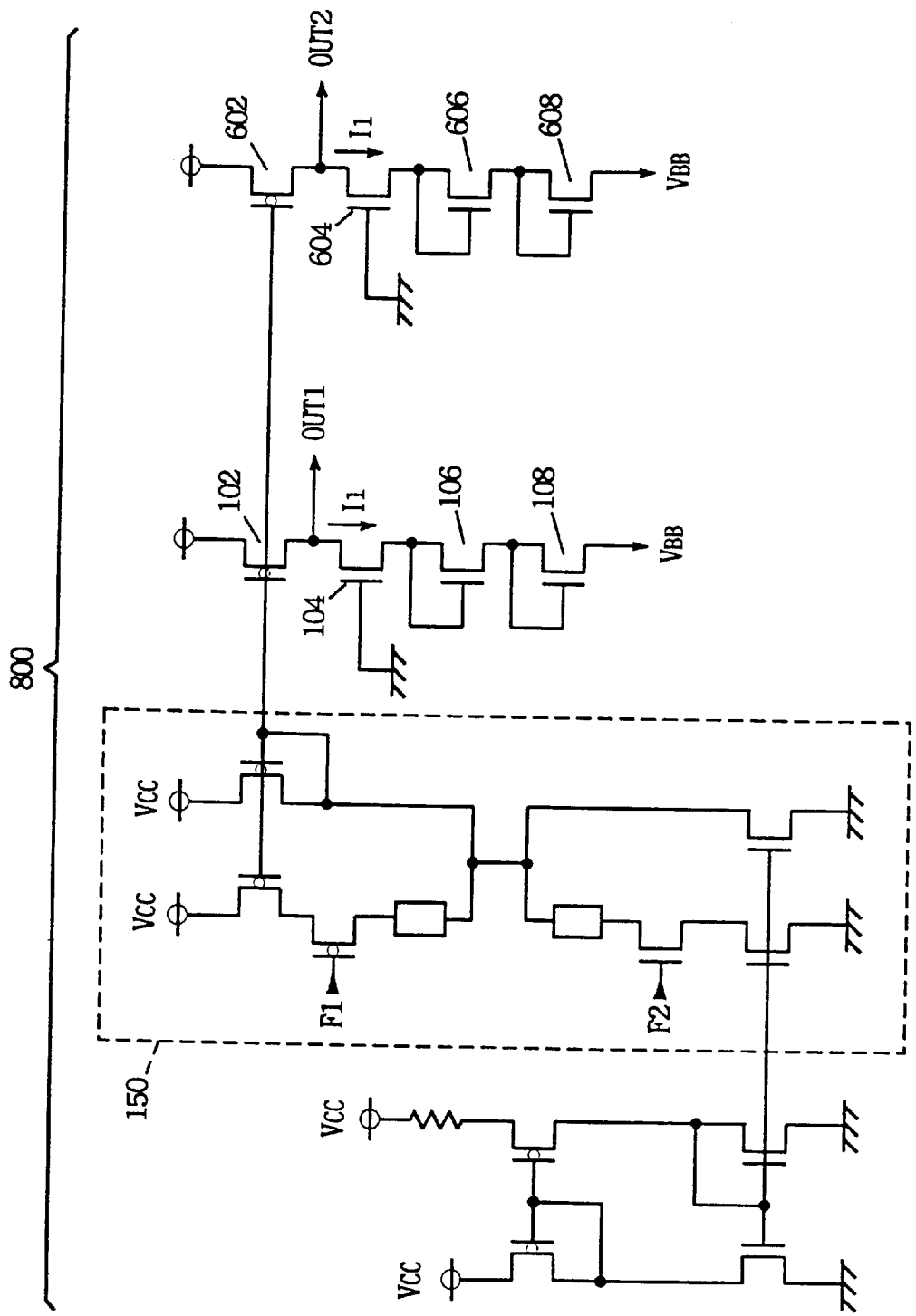
FIG. 16 is a schematic block diagram showing a ninth embodiment of the present invention.

FIG. 16 is a schematic block diagram showing a structure of a substrate potential generation circuit according to a ninth embodiment of the present invention.

The substrate potential generation circuit of the ninth embodiment differs from the substrate potential generation circuit of the eighth embodiment in that constant current source 610 is common to constant current source 110. More specifically, a constant current is applied to n channel MOSFETs 604, 606, and 608 by a p channel MOSFET 602 receiving the output of mirror ratio conversion circuit 150 at its gate to provide signal out2. In this case, a structure may be employed in which the same current $I_1$ is supplied instead of the structure of the eighth embodiment where two types of current values $I_1$ and $I_2$ are set.

More specifically, n channel MOSFETs 604, 606, and 608 in substrate potential level detection circuit 800 have their gate width adjusted so that the pull down current is smaller than that of n channel MOSFETs 104, 106 and 108.

FIG. 15A shows the relationship between the pull down current $i_A$ flowing to n channel MOSFETs 104, 106 and 108 and pull down current 1B flowing to n channel MOSFETs 604, 606, and 608 and the absolute value of substrate potential $V_{BB}$. With respect to the same $|V_{BB}|$, $i_B$ is smaller.

Therefore, signal out1 and signal out2 are switched at potential $-V_1$ and potential $-V_2$, respectively, with respect to the same supply current $I_1$.

Similar to the previous eighth embodiment, the substrate potential generation circuit has a clamping function at second predetermined potential $-V_2$ when the substrate potential is greatly shifted towards the negative side.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate potential generation circuit supplying a predetermined substrate potential to a semiconductor substrate, comprising:

first substrate potential level detection means for providing a first control signal according to a comparison result of a substrate potential and a first predetermined potential, wherein said first substrate potential level detection means comprises a first output node for providing said first control signal, a first input node coupled to said substrate potential, a first MOSFET of a first conductivity type having its drain directly connected to said first output node, its gate coupled to a reference potential, and its source connected to said first input node, and a first constant current generation means including a gate potential control circuit, said gate potential control circuit including a current mirror circuit having first to fourth input/output nodes, said first and second input/output nodes being connected to a first power source terminal, and for maintaining a first current flowing between said first and third input/output nodes and a second current flowing between said second and fourth input/output nodes at equal level, a second MOSFET of a second conductivity type having its source and drain connected to a second power source terminal and said third input/output node, respectively, and having its gate and drain connected, a third MOSFET of the second conductivity type having its drain connected to said fourth input/output node, and having a gate width/gate length ratio greater than that of said second MOSFET of the second conductivity type, a first internal node to which the gate of said second and third MOSFETs of the second conductivity type are connected in common, a resistor connected between the source of said third MOSFET of the second conductivity type and said second power source terminal, and a fourth MOSFET of the second conductivity type having its drain, source, and gate connected to said first output node, said second power source terminal, and said first internal node respectively, said substrate potential generation circuit further comprising:

oscillator means for switching between and active state and an inactive state according to said first control signal, and charge pump means receiving an output of said oscillator means for providing said substrate potential.

2. The substrate potential generation circuit according to claim 1, wherein said second and third MOSFETs operate under such a condition that both said second and third MOSFETs can conduct subthreshold current.

3. The substrate potential generation circuit according to claim 1, wherein said constant current generation circuit further comprises:

a first power source for supplying a first power supply potential, a second power source for supplying a second power supply potential, and a gate potential control circuit, wherein said gate potential control circuit comprises a pair of fifth and sixth MOSFETs of the first conductivity type forming a current mirror circuit, each source connected to said first power source, a second internal node to which the gates of said fifth and sixth MOSFETs of the first conductivity type are connected in common, a second MOSFET of the second conductivity type having a source and a drain connected to said second power source and a drain of said fifth MOSFET of the first conductivity type, respectively, and a gate connected to the drain, a third MOSFET of the second conductivity type having a gate and a drain connected to the gate of said second MOSFET of the second conductivity type and the drain of said sixth MOSFET of the first conductivity type, respectively, and having a gate width/gate length ratio greater than that of said second MOSFET of the second conductivity type, and a resistor connected between a source of said third MOSFET of the second conductivity type and said second power source, said substrate potential generation circuit further comprising:

a set of MOSFETs of the first conductivity type, each source and each gate connected to said first power source and said second internal node, respectively, first connection setting means for setting the connection between the drain of each MOSFET belonging to said set of MOSFETs of the first conductivity type and a third internal node independently and in a nonvolatile manner, a seventh MOSFET of the second conductivity type having a source and a drain connected to said second power source and said third internal node, respectively, and a gate connected to said drain, a set of MOSFET of the second conductivity type each source and each gate being connected to said second power source and the gate of the seventh MOSFET of the second conductivity type, respectively, second connection setting means for setting the connection between the drain of each MOSFET belonging to said set of MOSFETs of the second conductivity type and said third internal node individually and in a nonvolatile manner, and a fourth MOSFET of the second conductivity type, having a drain and a source connected to said first output node and the second power source, respectively, and a gate connected to each gate of said set of MOSFETs of the second conductivity type.

4. The substrate potential generation circuit according to claim 3, wherein said first and second connection setting means each comprises switching means for switching between an open state and a close state in response to an external signal.

5. A substrate potential generation circuit supplying a predetermined substrate potential to as semiconductor substrate, comprising:

a first substrate potential level detection means for providing a first control signal according to a comparison result of a substrate potential and a first predetermined potential, wherein said first substrate potential level detection means comprises a first output node for providing said first control signal, a first input node coupled to said substrate potential, a first MOSFET of first conductivity type having its drain directly connected to said first output node, its gate coupled to a reference potential, and its source connected to said first input node, a first constant current generation means including a gate potential control circuit, said gate potential control circuit including a current mirror circuit having first to fourth input/output nodes, said first and second input/output nodes being connected to a first power source terminal, and for maintaining a first current flowing between said first and third input/output nodes and a second current flowing between said second and fourth input/output nodes at equal level, a second MOSFET of a second conductivity type having its source and drain connected to a second power source terminal and said third input/output node, respectively, and having its gate and drain connected, a third MOSFET of the second conductivity type having its drain connected to said fourth input/output node, and having a rate width/gate length ratio greater than that of said second MOSFET of the second conductivity type, a first internal node to which the gate of said second and third MOSFETs of the second conductivity type are connected in common, a resistor connected between the source of said third MOSFET of the second conductivity type and a second power source terminal, and a fourth MOSFET of the second conductivity type having its drain, source, and gate connected to said first output node, said second power source terminal, and said first internal node, respectively, and at least one diode-connected MOSFET of the first conductivity type connected in series between said first input node and said semiconductor substrate, wherein a sum of a threshold value of said first MOSFET of the first conductivity type and said at least one diode-connected MOSFET of the first conductivity type corresponds to said first predetermined potential, said substrate potential generation circuit further comprises:

oscillator means switching between an active state and an inactive state according to said first control signal, and charge pump means receiving an output of said oscillation means for providing said substrate potential.

6. The substrate potential generation circuit according to claim 5, wherein said second and third MOSFETs operate under such a condition that both said second and third MOSFETs can conduct subthreshold current.

7. The substrate potential generation circuit according to claim 5, wherein said constant current generation means further comprises a first power source for supplying a first power supply potential, a second power source for supplying a second power supply potential, and a gate potential control circuit, wherein said gate potential control circuit comprises a pair of fifth and sixth MOSFETs of the first conductivity type forming a current mirror circuit, each source being connected to said first power source, a second internal node to which the gates of said fifth and sixth MOSFETs of the first conductivity type connected in common, a second MOSFET of the second conductivity type having a source and a drain connected to said second power source and a drain of said fifth MOSFET of the first conductivity type, respectively, and a gate connected to the drain, a third MOSFET of the second conductivity type having a gate and drain connected to the gate of said second MOSFET of the second conductivity type and the drain of said sixth MOSFET of the first conductivity type, respectively, and having an gate width/gate length ratio greater than that of the second MOSFET of the second conductivity type, and a resistor connected between the source of said third MOSFET of the second conductivity type and said second power source, said substrate potential generation circuit further comprising:

a set of MOSFETs of the first conductivity type, each source and each gate being connected to said first power source and said second internal node, respectively, first connection setting means for setting the connection between the drain of each MOSFET belonging to said set of MOSFETs of the first conductivity type and said third internal node individually and in a nonvolatile manner, a seventh MOSFET of the second conductivity type having a source and a drain connected to said second power source and said third internal node, respectively, and a gate connected to said drain, a set of MOSFETs of the second conductivity type having each source and each gate connected to said second power source and the gate of said seventh MOSFET of the second conductivity type, respectively, second connection setting means for setting connection between the drain of each MOSFET belonging to said set of MOSFETs of the second conductivity type and said third internal node individually and in a nonvolatile manner and a fourth MOSFET of the second conductivity type, having a drain, a source, and a gate connected to said first output node, said second power source and each gate of said set of MOSFETs of said second conductivity type, respectively.

8. The substrate potential generation circuit according to claim 7, wherein said first and said second connection setting means comprises first and second switching means respectively, each for switching between an open state and a close state according to an external signal.

9. The substrate potential generation circuit according to claim 8, wherein said first switching means comprises a first switching MOSFET connected in series between said third internal node and each MOSFET belonging to said set of MOSFET of the first conductivity type, wherein said second switching means comprises a second switching MOSFET connected in series between said third internal node and each MOSFET belonging to said set of MOSFET of the second conductivity type;

wherein said external signal includes a predetermined combination of an external clock signal, an external address signal and a mode switching signal, or an output signal of a sequential circuit or a combination circuit on the basis of said external clock signal, said external address signal, and said mode switching signal.

10. The substrate potential generation circuit according to claim 7, wherein said gate potential control circuit comprises a pair of fifth and sixth MOSFETs of the first conductivity type forming a current mirror circuit, each source being connected to said first power source, a second internal node to which the gates of said fifth and sixth MOSFETs of the first conductivity type are connected in common, a second MOSFET of the second conductivity type having a source and a drain connected to said second power source and to the drain of said second MOSFET of the first conductivity type, respectively, a third MOSFET of the second conductivity type having a gate and a drain connected to the drain of the second MOSFET of the second conductivity type and the drain of said sixth MOSFET of the first conductivity type, respectively, and a resistor having one end connected to said second power source and the other end connected to the gate of said second MOSFET of the second conductivity type and the source of said third MOSFET of the second conductivity type.

11. The substrate potential generation circuit according to claim 7, wherein said gate potential control circuit comprises a fifth MOSFET of the first conductivity type having a source and a gate connected to said first power source and said second power source, respectively, a sixth MOSFET of the first conductivity type having a source and a gate connected to said first power source and its own drain, respectively, a second internal node connected to the gate of said sixth MOSFET of the first conductivity type, a second MOSFET of the second conductivity type having a source and a drain connected to said second power source and the drain of said fifth MOSFET of the first conductivity type, a third MOSFET of the second conductivity type having a gate and a drain connected to the drain of said second MOSFET of the second conductivity type and the drain of said sixth MOSFET of the first conductivity type, respectively, and a resistor having one end connected to said third power source and another end connected to the gate of said first MOSFET of the second conductivity type and the source of said third MOSFET of the second conductivity type.

12. The substrate potential generation circuit according to claim 5, further comprising:

second constant current generation means including at least one pair of MOSFETs forming a current mirror circuit, wherein said oscillator means comprises an NAND circuit operating at a first logic level and a second logic level corresponding to a first power supply potential and a second power supply potential, respectively, and receiving said first control signal as a first input, an even number of cascaded inverter stages, each inverter operating at said first and second logic levels, wherein an input of the first stage is connected to an output of said NAND circuit and an output of the last stage is connected to a second input of said NAND circuit, and means connected in series in a path from said first potential to said second potential in said NAND circuit and each stage of said cascaded inverter stages, for limiting each operating current value to a value of current flowing to a current mirror circuit in said second constant current generation means.

13. The substrate potential generation circuit according to claim 12, wherein said second constant current generation means share at least said current mirror circuit with said first constant current generation means.

14. The substrate potential generation circuit according to claim 5, further comprising second substrate potential detection means for providing a second control signal according to a comparison result of said substrate potential and a second predetermined potential, wherein said second substrate potential level detection means comprises a second output node for providing said second control signal, a second input node connected to said substrate potential, third constant current generation means including at least one pair of MOSFETs forming a current mirror circuit, and having an output connected to said second output node, and an eighth MOSFET of the first conductivity type having a drain connected to said second output node, a gate coupled to a reference potential, and a source connected to said second input node, said substrate potential generation circuit further comprising clamp means for switching connection between a substrate and said first power supply to a conductive state or a non-conductive state according to said second control signal.

15. The substrate potential generation circuit according to claim 5, further comprising second substrate potential level detection means for providing a second control signal according to a comparison result of said substrate potential and a second predetermined potential, wherein said second substrate potential level detection means comprises a second output node for providing said second control signal, a second input node coupled to said substrate potential, third constant current generation means including at least one pair of MOSFETs forming a current mirror circuit, and having an output connected to said second output node, an eighth MOSFET of the first conductivity type having a drain connected to said second output node, a gate coupled to a reference potential, and a source connected to said second input node, at least one MOSFET of the first conductivity type connected in series between a source of said eighth MOSFET of the first conductivity type and said second input node, and being diode-connected, wherein a sum of a threshold value of said eighth MOSFET of the first conductivity type and a threshold value of said at least one MOSFET of the first conductivity type corresponds to said second detection potential, said substrate potential generation circuit further comprising clamp means for switching connection between a substrate and said first power source to a conductive state or a non-conductive state according to said second control signal.

16. The substrate potential generation circuit according to claim 14, wherein said third constant current generation means share at least said current mirror circuit with said first constant current generation means.

17. The substrate potential generation circuit according to claim 15, wherein said third constant current generation means share at least said current mirror circuit with said first constant current generation means.

18. A substrate potential generation circuit supplying a predetermined substrate potential to a semiconductor substrate, comprising:

a substrate potential level detection circuit for providing a control signal according to comparison result of a substrate potential and a first predetermined potential, wherein said substrate potential level detection circuit comprises an output node to be supplied with a constant current for providing said control signal, an input node coupled to said substrate potential, a first MOSFET of a first conductivity type wherein its drain receives said constant current from said output node, its gate is coupled to a second predetermined potential and its source provides said constant current for said input node, and a constant current generation circuit for supplying said constant current to said output node, said constant current generation circuit including a gate potential control circuit, said gate potential control circuit including a current mirror circuit having first to fourth input/output nodes, said first and second input/output nodes being connected to a first power source terminal, and for maintaining a first current flowing between said first and third input/output nodes and a second current flowing between said second and fourth input/output nodes at equal level, a second MOSFET of a second conductivity type having its source and drain connected to a second power source terminal and said third input/output node, respectively, and having its gate and drain connected, a third MOSFET of the second conductivity type having its drain connected to said fourth input/output node, and having a gate width/gate length ratio greater than that of said second MOSFET of the second conductivity type, a first internal node to which the gate of said second and third MOSFETs of the second conductivity type are connected in common, a resistor connected between the source of said third MOSFET of the second conductivity type and said second power source terminal, and a fourth MOSFET of the second conductivity type having its drain, source and gate connected to said first output node, said second power source terminal, and said first internal node, respectively, said substrate potential generation circuit further comprises:

an oscillator switching between an active state and an inactive state according to said control signal, and a charge pump circuit receiving an output of said oscillator for providing said substrate potential.

19. The substrate potential generation circuit according to claim 18, wherein said drain of the first MOSFET is directly connected to said output node.

20. The substrate potential generation circuit according to claim 18, wherein said source of the first MOSFET is directly connected to said input node.

21. The substrate potential generation circuit according to claim 18, wherein said oscillator includes a gate circuit activated by said control signal, and a plurality of delay circuits, connected to form a closed loop together with said gate circuit, for transmitting an oscillating signal, and said oscillator starts oscillating upon activation of said gate circuit.

22. The substrate potential generation circuit according to claim 18, wherein said second and third MOSFETs operate under such a condition that both said second and third MOSFETs can conduct subthreshold current.

23. A substrate potential generation circuit supplying a predetermined substrate potential to a semiconductor substrate, comprising:

a substrate potential level detection circuit for providing a control signal according to comparison result of a substrate potential and a first predetermined potential, wherein said substrate potential level detection circuit comprises an output node to be supplied with a constant current for providing said control signal, an input node coupled to said substrate potential, a first MOSFET of a first conductivity type wherein its drain receives said constant current from said output node, its gate is coupled to a second predetermined potential, and its source provides said constant current for said input node, a constant current generation circuit for supplying said constant current to said output node, said constant current generation circuit including, a gate potential control circuit, said gate potential control circuit including a current mirror circuit having first to fourth input/output nodes, said first and second input/output nodes being connected to a first power source terminal, and for maintaining a first current flowing between said first and third input/output nodes and a second current flowing between said second and fourth input/output nodes at equal level, a second MOSFET of a second conductivity type having its source and drain connected to a second power source terminal and said third input/output node, respectively, and having its gate and drain connected, a third MOSFET of the second conductivity type having its drain connected to said fourth input/output node, and having a gate width/gate length ratio greater than that of said second MOSFET of the second conductivity type, a first internal node to which the gate of said second and third MOSFETs of the second conductivity type are connected in common, a resistor connected between the source of said third MOSFET of the second conductivity type and said second power source terminal, and a fourth MOSFET of the second conductivity type having its drain, source, and gate connected to said first output node, said second power source terminal, and said first internal node, respectively, and at least one diode-connected MOSFET of the first conductivity type coupled in series between said input node and said semiconductor substrate, wherein said first predetermined potential varies linearly with a sum of a threshold value of said at least one diode-connected MOSFET of the first conductivity type, said substrate potential generation circuit further comprises:

an oscillator switching between an active state and an inactive state according to said control signal, and a charge pump circuit receiving an output of said oscillator for providing said substrate potential.

24. The substrate potential generation circuit according to claim 23, wherein said drain of the first MOSFET is directly connected to said output node.

25. The substrate potential generation circuit according to claim 23, wherein said source of the first MOSFET is directly connected to said input node.

26. The substrate potential generation circuit according to claim 23, wherein said oscillator includes a gate circuit activated by said control signal, and a plurality of delay circuits, connected to form a closed loop together with said gate circuit, for transmitting an oscillating signal, and said oscillator starts oscillating upon activation of said gate circuit.

27. The substrate potential generation circuit according to claim 23, wherein said second and third MOSFETs operate under such a condition that both said second and third MOSFETs can conduct subthreshold current.

* * * * *